(12) United States Patent
Arakane et al.

(10) Patent No.: US 8,623,524 B2
(45) Date of Patent: Jan. 7, 2014

(54) ORGANIC ELECTROLUMINESCENT DEVICE

(71) Applicant: Idemitsu Kosan Co., Ltd., Chiyoda-ku (JP)

(72) Inventors: Takashi Arakane, Sodegaura (JP); Toshihiro Iwakuma, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/742,645

(22) Filed: Jan. 16, 2013

(65) Prior Publication Data

US 2013/0126849 A1 May 23, 2013

Related U.S. Application Data

(63) Continuation of application No. 10/529,238, filed as application No. PCT/JP03/12598 on Oct. 1, 2003, now abandoned.

(30) Foreign Application Priority Data

Oct. 9, 2002 (JP) ................................. 2002-296024

(51) Int. Cl.
*H01L 51/54* (2006.01)

(52) U.S. Cl.
USPC ........... 428/690; 428/917; 313/504; 313/506; 252/301.16; 257/40; 257/89; 257/103

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,834,894 A | 11/1998 | Shirasaki et al. | |
| 6,097,147 A | 8/2000 | Baldo et al. | |
| 6,137,223 A | 10/2000 | Hung et al. | |
| 6,509,109 B1 | 1/2003 | Nakamura et al. | |
| 6,656,612 B2 | 12/2003 | Okada et al. | |
| 6,680,577 B1 | 1/2004 | Inukai et al. | |
| 6,830,828 B2 | 12/2004 | Thompson et al. | |
| 2002/0028329 A1 | 3/2002 | Ise et al. | |
| 2002/0045061 A1 | 4/2002 | Hosokawa | |
| 2002/0055014 A1 | 5/2002 | Okada et al. | |
| 2002/0096995 A1 | 7/2002 | Mishima et al. | |
| 2003/0068528 A1 | 4/2003 | Thompson et al. | |
| 2003/0218418 A9 | 11/2003 | Sato et al. | |
| 2004/0086745 A1* | 5/2004 | Iwakuma et al. | 428/690 |
| 2004/0142208 A1 | 7/2004 | Hamada et al. | |
| 2004/0247933 A1 | 12/2004 | Thoms | |

FOREIGN PATENT DOCUMENTS

| | | |
|---|---|---|
| CN | 1236825 | 12/1999 |
| EP | 0 697 744 A1 | 2/1996 |
| EP | 1 083 612 | 3/2001 |
| EP | 1 308 494 A2 | 5/2003 |
| JP | 2002-056976 | 2/2002 |
| JP | 2002-151267 | 5/2002 |
| JP | 2002-352957 | 12/2002 |
| JP | 2003-077673 | 3/2003 |
| TW | 476227 | 2/2002 |
| WO | 00/70655 | 11/2000 |
| WO | 01/93642 A1 | 12/2001 |
| WO | 02/15645 A1 | 2/2002 |
| WO | 02/51206 | 6/2002 |
| WO | 02/071813 | 9/2002 |

OTHER PUBLICATIONS

Tominaga et al. JP(2001)-006877, machine assisted translation.
So et al., DOE Solid-State Lighting Workshop, Sanfrancisco, CA (2009).
Bernede et al., SCELL-2004 International Conference on Physics, Chemistry and Engineering of Solar Cells, Badajoz, Espagne (May 13, 2004), vol. 87, No. 1-4, pp. 261-270 (Abstract) (2005).
Wu et al., Advanced Materials, vol. 20, pp. 2359-2364 (2008).
Matsushima et al., Current Applied Physics, vol. 5, pp. 305-308 (2005).
Adachi et al., Organic Electronics, vol. 2, pp. 37-43 (2001).
Tanaka et al., Japan Journal of Applied Physics, vol. 42, pp. 2737-2740 (2003).
Machine Translation, JP 2000-169448, Fujino et al.
Baldo et al., "Transient analysis of organic electrophosphorescence: 1. Transient analysis of triplet energy transfer," Physical Review B, vol. 62, No. 16, pp. 10958-10966 (Oct. 15, 2000).
Adachi et al., "Nearly 100% internal phosphorescence efficiency in an organic light emitting device", Journal of Applied Physics, vol. 90, No. 10, pp. 5048-5051 (2001).

* cited by examiner

*Primary Examiner* — Michael H Wilson
(74) *Attorney, Agent, or Firm* — Oblon, Spivak, McClelland, Maier & Neustadt, L.L.P.

(57) ABSTRACT

An organic electroluminescence device comprising a cathode, an anode and at least one layer comprising a phosphorescent light emitting material and a host material which is sandwiched between the cathode and the anode and further comprising an electron injecting layer which is adhered to the light emitting layer and is capable of transporting electrons, wherein an ionization potential of the host material is 5.9 eV or smaller, and wherein an energy gap of the electron transporting material in the electron injecting layer is smaller than that of the host material in the light emitting layer or wherein a triplet energy of the electron transporting material in the electron injecting layer is smaller than that of the host material in the light emitting layer. It emits phosphorescent light with enhanced efficiency because it comprises a light emitting layer and an electron injecting layer both satisfying specified condition and employs a light emitting layer capable of electron transporting.

18 Claims, No Drawings

ORGANIC ELECTROLUMINESCENT DEVICE

TECHNICAL FIELD

The present invention relates to an organic electroluminescent device (an electroluminescent device will be referred to as an electroluminescence device, hereinafter) and, more particularly, to an electroluminescence device which utilizes phosphorescent light emission, exhibits a great efficiency of light emission under the application of lower driving voltage.

BACKGROUND ART

An organic electroluminescence ("electroluminescence" will be occasionally referred to as "EL", hereinafter) device is a spontaneous light emitting device which utilizes the principle that a fluorescent substance emits light by energy of recombination of holes injected from an anode and electrons injected from a cathode when an electric field is applied. Since an organic EL device of the laminate type driven under a low electric voltage was reported by C. W. Tang of Eastman Kodak Company (C. W. Tang and S. A. Vanslyke, Applied Physics Letters, Volume 51, Pages 913, 1987), many studies have been conducted on organic EL devices using organic materials as the constituting materials. Tang et al. used a laminate structure using tris(8-hydroxyquinolinol)aluminum for the light emitting layer and a triphenyldiamine derivative for the hole transporting layer. Advantages of the laminate structure are that the efficiency of hole injection into the light emitting layer can be increased, that the efficiency of forming excited particles which are formed by blocking and recombining electrons injected from the cathode can be increased, and that excited particles formed among the light emitting layer can be enclosed. As the structure of the organic EL device, a two-layered structure having a hole transporting (injecting) layer and an electron transporting and light emitting layer and a three-layered structure having a hole transporting (injecting) layer, a light emitting layer and an electron transporting (injecting) layer are well known. To increase the efficiency of recombination of injected holes and electrons in the devices of the laminate type, the structure of the device and the process for forming the device have been studied.

As the light emitting material of the organic EL device, chelate complexes such as tris(8-quinolinolato)aluminum, coumarine derivatives, tetraphenylbutadiene derivatives, bis-styrylarylene derivatives and oxadiazole derivatives are known. It is reported that light in the visible region ranging from blue light to red light can be obtained by using these light emitting materials, and development of a device exhibiting color images is expected (For example, Japanese Unexamined Patent Application Laid-Open Nos. Heisei 8 (1996)-239655 and Heisei 7 (1995)-138561).

It is recently proposed that an organic phosphorescent materials is used in the light emitting layer of an organic EL device in combination with a light emitting material (for example, D. F. O'Brien, M. A. Baldo et al., "Improved energy transfer in electrophosphorescent devices", Applied Physics Letters, Vol. 74, No. 3, Pages 442 to 444, Jan. 18, 1999; and M. A. Baldo et al., "Very high-efficiency green organic light-emitting devices based on electrophosphorescence", Applied Physics Letters, Vol. 75, No. 1, Pages 4 to 6, Jul. 5, 1999).

As described above, a great efficiency of light emission is achieved by utilizing an organic phosphorescent material excited to the singlet state and the triplet state in the light emitting layer of an organic EL device. It is considered that singlet excimers and triplet excimers are formed in relative amounts of 1:3 due to the difference in the multiplicity of spin when electrons and holes are recombined in an organic EL device. Therefore, it is expected that an efficiency of light emission 3 to 4 times as great as that of a device utilizing fluorescence alone can be achieved by utilizing a phosphorescent light emitting material.

In the organic EL devices such as those described above, constructions in which layers such as an anode, an organic light emitting layer, an electron transporting layer (a hole blocking layer), an electron injecting layer and a cathode are successively laminated are used so that light emission in the condition excited to the triplet state or from excimers in the triplet state is not quenched (for example, the U.S. Pat. No. 6,097,147, and International Patent Application Published under PCT No. WO01/41512). To organic EL device with the above construction had the following characteristics:

(i) Either a hole blocking layer having larger energy gap than the light emitting layer or a hole blocking layer having greater triplet energy than the light emitting layer was generally used because the excitation state quenched when the electron injecting layer was adhered to the light emitting layer.

(ii) With regard to the hole blocking layer, it was possible to improve recombination probability with electrons by restricting the mobility of the holes from the organic light emitting layer and efficiently accumulating the holes in the light emitting layer.

(iii) It was necessary to dispose an electron injecting layer having smaller energy gap than the hole blocking layer between the hole blocking layer and the cathode because a direct connection between the hole blocking layer and the cathode metal furiously degrade the property such as lifetime or efficiency.

However, it was found that the conventional constructions for electron injection have problems. Namely, because the hole blocking layer has large energy gap, and because it works with great resistance as an energy barrier for charge injection transport from the other layer, the driving voltage elevated. Further, although many compounds used for the hole blocking layer held favorable hole barrier capability, they tended to deteriorate, and failed to provide an organic EL device with long lifetime.

Japanese Unexamined Patent Application Laid-Open No. 2002-100476 discloses, as a conventional device, an EL device essentially consisting of an electron injecting layer and an adjacent light emitting layer wherein the lowest excited triplet energy level of a host material in the electron injecting layer is higher than the lowest excited triplet energy level of a host material in the light emitting layer. However, in the EL device with increased triplet energy of an electron transporting material, although it avoids quench, the energy gap of electron transporting material becomes extraordinarily great resultantly reaches to 3 eV or greater because singlet energy is generally 0.3 eV or more greater than triplet energy. In this case, there are problems that the energy barrier against the electron injection from cathode becomes so great that the driving voltage elevates, and in the case where the energy barrier is great, a continuation of an electric current injection will induce degradation of the EL device and will make the lifetime of the EL device short as a result.

Further, International Patent Application Published under PCT No. WO01/93642 discloses an organic EL device wherein the host material in the light emitting layer is formed of the electron transporting material. However, there are problems that, because the host material employed for the EL device had an ionization potential of 5.9 eV or more, it fails to inject holes into the host material, prohibiting the host material from transporting holes thereby causing an elevation of the driving voltage.

DISCLOSURE OF THE INVENTION

The present invention has an object of overcoming the above problems and providing an organic EL device utilizing phosphorescent light emission which exhibits a great efficiency of light emission even with relatively lower driving voltage.

As the result of intensive researches and studies to achieve the above object by the present inventors, the first aspect of the present invention provides an organic EL device, which comprises an light emitting layer consisting of at least phosphorescent light emitting material and a host material, a cathode, and an electron injecting layer adhered to the light emitting layer and at the same time sandwiched between the light emitting layer and the cathode, without employing any hole blocking layer. Further, the first aspect of the invention made the energy gap of electron transporting material in electron injecting layer smaller than that of the host material in the light emitting layer. According to the conventional comprehension by the persons skilled in the art, the above settlement will let the electron injecting layer deactivates the excitation state generated in the light emitting layer and only the EL devices with extremely low efficiency will be provided. In the present invention, however, enabling the light emitting layer electron transporting, an electron-hole recombination zone will separate from the interface between the electron injecting layer and the light emitting layer resulting in avoidance of deactivation. Besides, an EL device with high efficiency without the use of the hole blocking layer in the conventional organic EL device is provided by making the ionization potential of the host material 5.9 eV or lower in order to enable holes easily inject into the host material in the light emitting layer. Further, the driving voltage can be decreased because the holes are injected into the host material in the light emitting layer thereby allowing the transportation, and an organic EL device with long lifetime can be obtained because any hole blocking layer that easily deteriorates is not employed. Furthermore, the organic EL device is easily producible because its constitution became simple. Moreover, it was ensured that the energy gap of electron transporting material in electron injecting layer smaller than that of the host material in the light emitting layer has also an effect of promoting injection of electrons from cathode as well as decreasing the driving voltage.

The second aspect of the invention provides an organic EL device, which comprises an light emitting layer consisting of at least phosphorescent light emitting material and a host material, a cathode, and an electron injecting layer adhered to the light emitting layer and at the same time sandwiched between the light emitting material and the cathode, wherein a triplet energy of an electron transporting material in the electron injecting layer is smaller than that of the host material in the light emitting layer. This reduces the energy gap of electron transporting material and improves the injection of electrons from cathode remarkably. According to the conventional comprehension by the persons skilled in the art, the above settlement will let the electron injecting layer deactivates the excitation state generated in the light emitting layer and only the EL devices with extremely low efficiency will be provided. In the present invention, however, enabling the light emitting layer electron transporting, an electron-hole recombination zone will separate from the interface between the electron injecting layer and the light emitting layer resulting in avoidance of deactivation. Besides, an EL device with high efficiency without the use of the electron injecting layer with large energy gap in the conventional organic EL device is provided by making the ionization potential of the host material 5.9 eV or lower in order to enable holes easily inject into the host material in the light emitting layer. The organic EL device with improved long lifetime was obtained as the effect of making energy barrier for electron injection smaller. Still further, the driving voltage can be decreased because holes can be injected into the host material in the light emitting layer, thereby allowing transportation. Furthermore, the organic EL device is easily producible because its constitution became simple.

Namely, the first aspect of the present invention provides an organic electroluminescence device comprising a cathode, an anode and at least one layer comprising a phosphorescent light emitting material and a host material which is sandwiched between the cathode and the anode and further comprising an electron injecting layer which is adhered to the light emitting layer and is capable of transporting electrons, wherein an ionization potential of the host material is 5.9 eV or smaller, and wherein an energy gap of the electron transporting material in the electron injecting layer is smaller than that of the host material in the light emitting layer.

Further, the second aspect of the present invention provides an organic electroluminescence device comprising a cathode, an anode and at least one layer comprising a phosphorescent light emitting material and a host material which is sandwiched between the cathode and the anode and further comprising an electron injecting layer which is adhered to the light emitting layer and is capable of transporting electrons, wherein an ionization potential of the host material is 5.9 eV or smaller, and wherein a triplet energy of the electron transporting material in the electron injecting layer is smaller than that of the host material in the light emitting layer.

As the foregoing description, it is essential that light emitting layer is capable of transporting electrons both in the first aspect of the invention and in the second aspect of the invention (they are expressed as the present invention below), and either (1) or (2) below is defined as electron transporting capability in the present invention.

(1) The host material in the light emitting layer is a chemical compound with an electron mobility of $10^{-6}$ cm$^2$/Vs or greater, preferably of $10^{-5}$ cm$^2$/Vs or greater. With regards to the electron mobility, it can be measured by time of flight method (TOF) or transient measurement about a space charge limiting current. As for the TOF method, it is described on page 331 in Synthetic Metals (Synth. Met.) 111/112, (2000), and as for the transient measurement about the space charge limiting current, it is described on pages 346-348 of Electrical Transport in Solids, Pergamon Press (1981).

(2) The recombination between the holes and the electrons in the zone on the anode side of the light emitting layer is more frequent than that in the zone on the cathode side of the light emitting layer. Namely, in the case of dividing the zone of the light emitting layer into two zones and providing constitution of layers (cathode/electron injecting layer/cathode side light emitting layer/anode side light emitting layer/hole transporting layer/anode), comparing device AN made by adding phosphorescent compound only in the anode side light emitting layer with device CA made by adding phosphorescent compound only in the cathode side light emitting layer indicates that device AN corresponds exhibiting frequent recombination. On that occasion, attention should be paid so that neither the electron injecting layer nor the hole transporting layer might quench the excitation state of the light emitting layer. Further, comparing the efficiency of device AN' made by adding phosphorescent compound only in the anode side interface of the light emitting layer with the efficiency of device CA' made by adding phosphorescent compound only in the cathode side interface of the light emitting layer, the light emitting layer is estimated as capable of transporting electrons when the efficiency of device AN' is greater than that of device CA'.

However, the capability of transporting electrons does not mean without capability of transporting holes in the present invention. Therefore, having the capability of transporting electrons does not contradict with having the measured value of hole mobility with $10^{-7}$ cm$^2$/Vs or more.

In the organic EL device of the present invention, it is preferable that a reductive dopant is added in the electron injecting layer or in the interface zone between the cathode and the layer adhered with the cathode. Any one of the above addition enables decreasing the driving voltage of the EL device.

In the organic EL device of the present invention, a hole transporting layer in which a phosphorescent light emitting material is added may be preferably sandwiched between the cathode and the anode.

By providing the hole transporting layer, an excitation state which may occur in the hole transporting layer will enhance the light emission, thereby improving the current efficiency still extravagantly.

Further, it is preferable that the triplet energy of the hole transporting material in the hole transporting layer is greater than the excitation energy of the phosphorescent light emitting material in the light emitting layer. By satisfying the above condition, the hole transporting material will protect the excitation state of the light emitting layer against quenching, thereby improving the current efficiency still extravagantly.

THE PREFERRED EMBODIMENT TO CARRY OUT THE INVENTION

The first aspect of the present invention provides an organic electroluminescence device comprising a cathode, an anode and at least one layer comprising a phosphorescent light emitting material and a host material which is sandwiched between the cathode and the anode and further comprising an electron injecting layer which is adhered to the light emitting layer and is capable of transporting electrons, wherein an ionization potential of the host material is 5.9 eV or smaller (preferably 5.8 eV or smaller) and wherein an energy gap of the electron transporting material in the electron injecting layer is smaller than that of the host material in the light emitting layer.

The second aspect of the present invention provides an organic electroluminescence device comprising a cathode, an anode and at least one layer comprising a phosphorescent light emitting material and a host material which is sandwiched between the cathode and the anode and further comprising an electron injecting layer which is adhered to the light emitting layer and is capable of transporting electrons, wherein an ionization potential of the host material is 5.9 eV or smaller (preferably 5.8 eV or smaller), and wherein a triplet energy of the electron transporting material in the electron injecting layer is smaller than that of the host material in the light emitting layer.

It is preferable that the host material in the light emitting layer has electron transporting capability, and that the electron mobility in the host material is $10^{-6}$ cm$^2$/Vs or greater.

With regard to the host material in the light emitting layer, conventionally employed polycarbazole compounds such as polyvinylcarbazole or biscarbazole has hole transporting capability exclusive of exception, and at the same time, has little electron transporting capability. In an occasion of employing the above hole transporting material as the host material, a cathode side interface of the light emitting layer becomes the main recombination zone. In this occasion, adhering the electron injecting layer with the light emitting layer as well as intervening the electron injecting layer between the light emitting layer and the cathode and adding the electron transporting material with an energy gap smaller then the energy gap forming the light emitting layer into the electron injecting layer will deactivate the excitation state generated mainly on the cathode side interface of the light emitting layer, and as a result, only the EL device with extremely low efficiency is obtained. Further, in an occasion of employing the electron transporting material with the triplet energy for forming the electron injecting layer smaller than the triplet energy of the host material forming the light emitting layer, the excitation state generated mainly on the cathode side interface of the light emitting layer will be deactivated by the electron injecting layer, and as a result, only the EL device with extremely low efficiency is obtained.

On the other hand, because the light emitting layer has electron transporting capability in the present invention, an electron-hole recombination zone will separate from the interface between the electron injecting layer and the light emitting layer, resulting in avoidance of deactivation of the generated excitation state.

Further, an ionization potential of the host material in the light emitting layer is 5.9 eV or smaller in the present invention. By employing the above ionization potential, an energy barrier can be arranged to −0.2 to 0.6 eV because the ionization potential of the hole transporting material is 5.3 to 5.7 eV, which enables to inject holes into the host material. Furthermore, those compounds which decrease the driving voltage can be employed because the holes become transportable among the host material.

It is preferable that the host material in the light emitting layer is a compound which is prepared by coupling either carbazolyl group or azacarbazolyl group with a ring having nitrogen atom, or a compound which is prepared by coupling through an arylene group either carbazolyl group or azacarbazolyl group a ring having nitrogen atom.

Each of the carbazolyl group, the azacarbazolyl group, the ring having nitrogen atom and the arylene group may be respectively substituted. Examples of the substituent include hydrogen atom, halogen atoms, hydroxyl group, amino group, nitro group, cyano group, alkyl groups, alkenyl groups, cycloalkyl groups, alkoxyl groups, aromatic hydrocarbon groups, aromatic heterocyclic groups, aralkyl groups, aryloxyl groups, alkoxycarbonyl groups and carboxyl group.

Also, it is more preferable that the host material in the light emitting layer is a compound represented by following general formula (1):

$$(Cz-)_m A \tag{1}$$

wherein Cz represents a substituted or unsubstituted carbazolyl group or a substituted or unsubstituted azacarbazolyl group, A represents a ring group having nitrogen atom and which is substituted by aryl, a ring group having nitrogen atom and which is substituted by diaryl or a ring group having nitrogen atom and which is substituted by triaryl; and m is an integer of 1 to 3;

or following general formula (2):

$$Cz-A_n \tag{2}$$

wherein Cz represents a substituted or unsubstituted carbazolyl group or a substituted or unsubstituted azacarbazolyl group, A represents a ring group having nitrogen atom and which is substituted by aryl, a ring group having nitrogen atom and which is substituted by diaryl or a ring group having nitrogen atom and which is substituted by triaryl; and n is an integer of 1 to 3.

Preferable examples of the ring group having nitrogen atom in the host material include rings of pyridine, quinoline, pyrazine, pyrimidine, quinoxaline, triazine, imidazole, imidazopyridine, pyridazine and benzimidazole.

Moreover, it became clear that the ionization potential at the site of Cz in general formulae (1) and (2) fell within the values of from 5.6 eV to 5.8 eV. As the light emitting material, phosphorescent organometallic complexes are preferable since the external quantum efficiency of the device can be improved. Examples of the metal in the phosphorescent organometallic complex, include ruthenium, rhodium, palladium, silver, rhenium, osmium, iridium, platinum and gold. It is preferable that the organometallic complex is an organometallic compound represented by the following general formula (3):

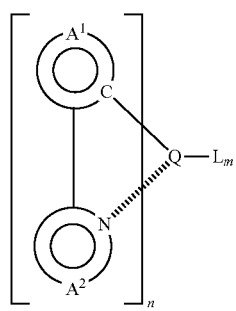

(3)

In the above general formula (3), $A^1$ represents a substituted or unsubstituted aromatic hydrocarbon cyclic group or aromatic heterocyclic group which is preferably phenyl group, biphenyl group, naphthyl group, anthryl group, thienyl group, pyridyl group, quinolyl group or isoquinolyl group. Examples of the substituent include halogen atoms such as fluorine atom; alkyl groups having 1 to 30 carbon atoms such as methyl group and ethyl group; alkenyl groups such as vinyl group; alkoxycarbonyl groups having 1 to 30 carbon atoms such as methoxycarbonyl group and ethoxycarbonyl group; alkoxyl groups having 1 to 30 carbon atoms such as methoxy group and ethoxyl group; aryloxy groups such as phenoxyl group and benzyloxyl group; dialkylamino groups such as dimethylamino group and diethylamino group; acyl groups such as acetyl group; haloalkyl groups such as trifluoromethyl group; and cyano group.

$A^2$ represents a substituted or unsubstituted aromatic heterocyclic group having nitrogen atom as the atom forming the heterocyclic ring, which is preferably pyridyl group, pirimidyl group, pyrazine group, triazine group, benzothiazole group, benzoxazole group, benzimidazole group, quinolyl group, isoquinolyl group, quinoxaline group or phenanthridine group. Examples of the substituent include the substituents described as the examples of the substituent for the group represented by $A^1$.

The ring having the group represented by $A^1$ and the ring having the group represented by $A^2$ may form one condensed ring. Examples of the condensed ring include 7,8-benzoquinoline group, etc.

Q represents a metal selected from metals of Groups 7 to 11 of the Periodic Table, which is preferably ruthenium, rhodium, palladium, silver, rhenium, osmium, iridium, platinum or gold.

L represents a bidentate ligand, which is preferably selected from pyromellitic acid or ligands of the β-diketone type such as acetylacetonates.

m and n each represent an integer. When Q represents a divalent metal, n=2 and m=0. When Q represents a trivalent metal, n=3 and m=0 or n=2 and m=1.

Specific examples of the organometallic complex represented by the above general formula (3) are shown in the following. However, the organometallic complex is not limited to these compounds.

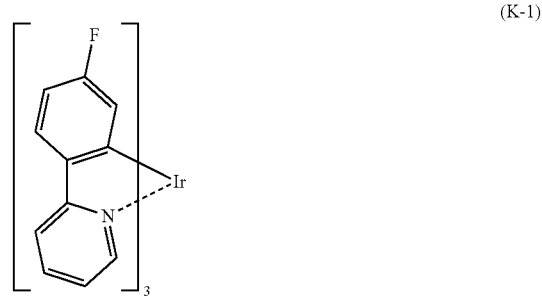

(K-1)

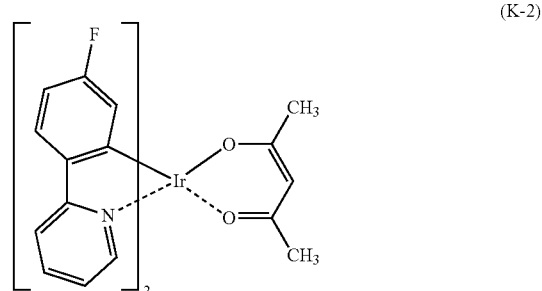

(K-2)

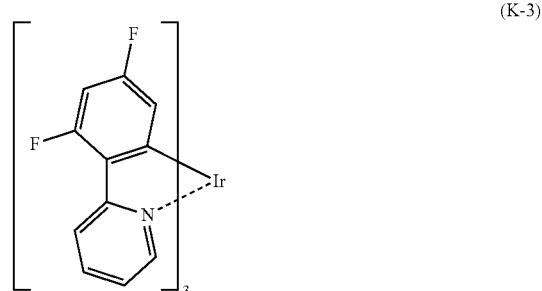

(K-3)

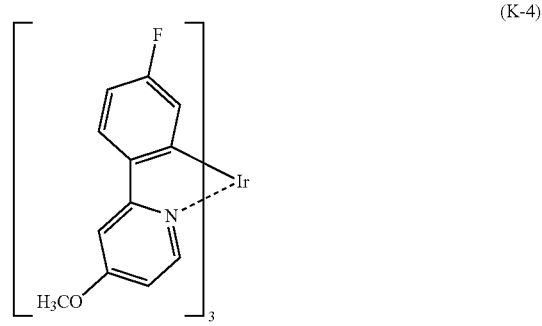

(K-4)

-continued
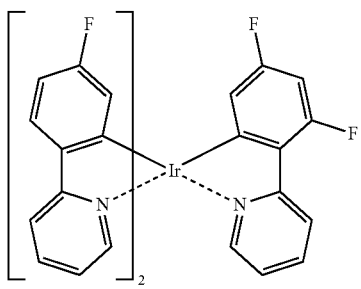 (K-5)
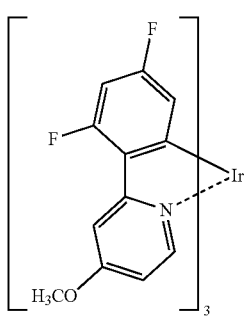 (K-6)
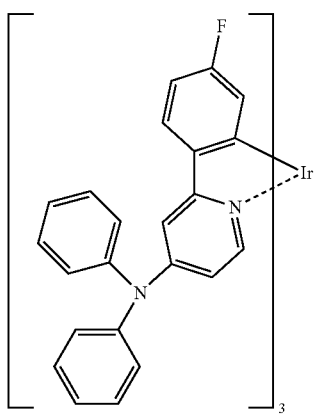 (K-7)
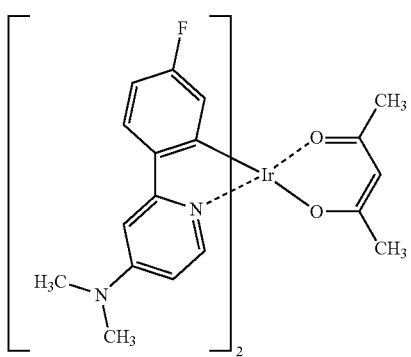 (K-8)
-continued
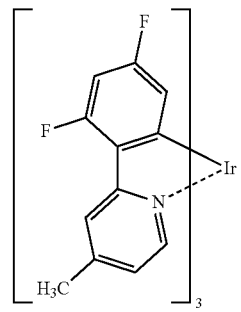 (K-9)
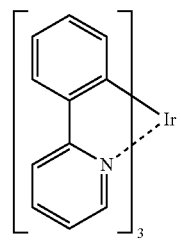 (K-10)
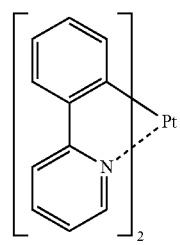 (K-11)
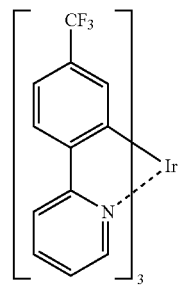 (K-12)
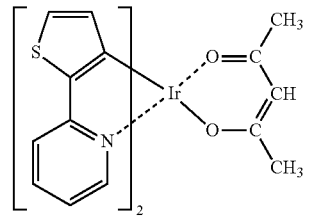 (K-13)
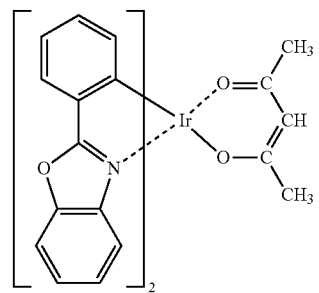 (K-14)

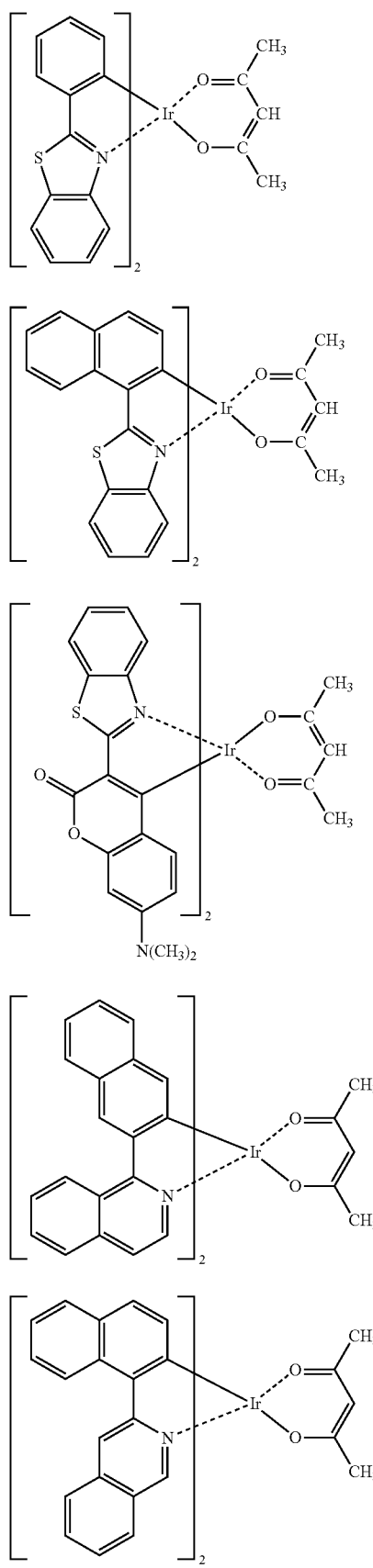
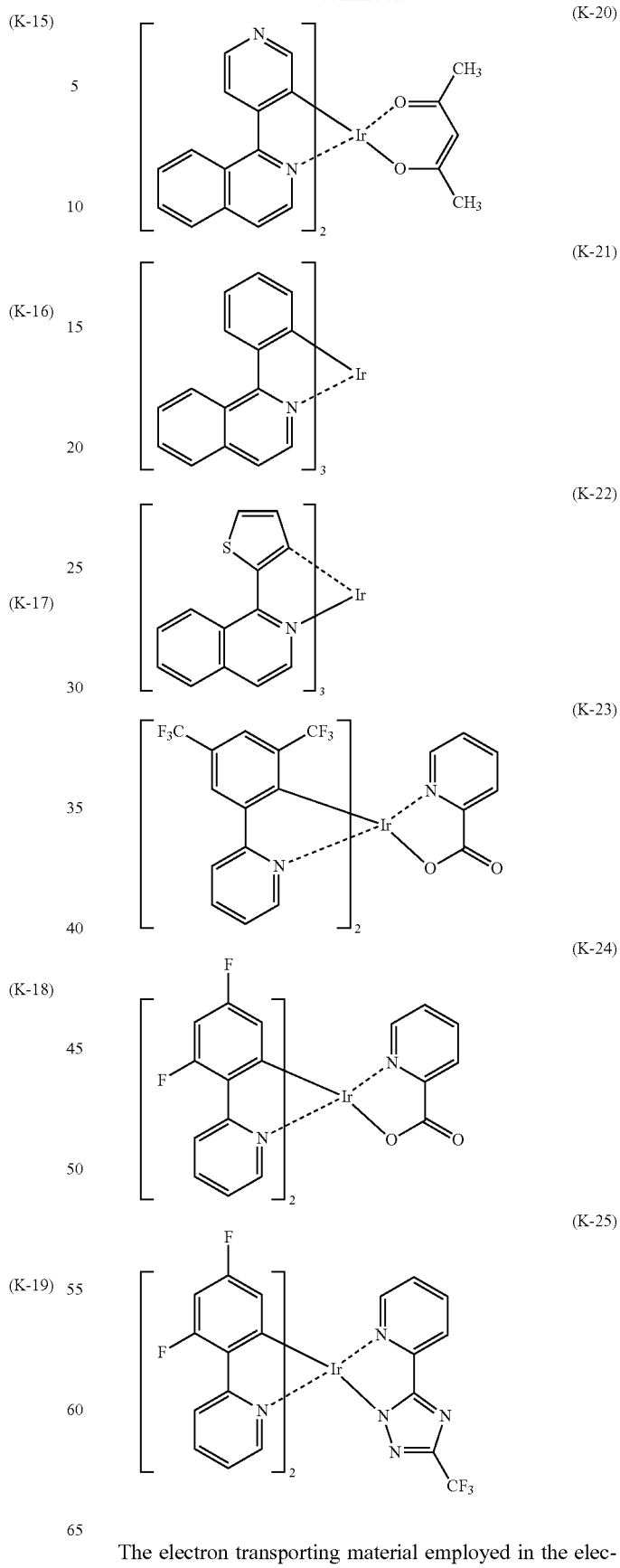
The electron transporting material employed in the electron injecting layer of the present invention is enhanced in the electron injecting capability by selecting the energy gap of the electron transporting material as smaller than that of the host material in the light emitting layer, or by selecting the triplet energy of the electron transporting material as smaller than that of the host material in the light emitting layer each as the foregoing description.

The energy gap of the electron transporting material in the electron injecting layer is preferably 2.8 eV or smaller, and more preferably 2.75 eV or smaller. Preferable examples of the electron transporting material include a heterocyclic compound having nitrogen atom. It is defined as a compound with a heterocyclic structure and having nitrogen atom, examples of which include a complex having a nitrogen atom and a compound with a ring structure and having nitrogen atom.

Examples of the complex having a nitrogen atom include complexes represented by the following general formulae (4) to (6):

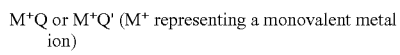     (4)

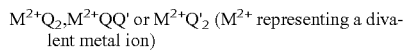     (5)

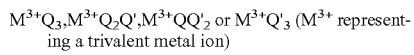     (6)

Examples of the ligands represented by Q and Q' include ligands represented by the following general formulae (7) and (8a) to (8c).

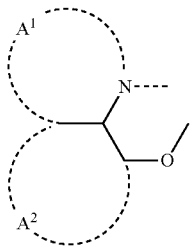     (7)

wherein $A^1$ and $A^2$ each independently represent a substituted or unsubstituted aromatic cyclic structure.

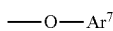     (8a)

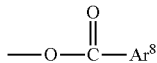     (8b)

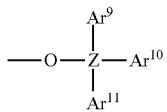     (8c)

wherein Z represents an atom selected from Si, Ge and Sn and $Ar^7$ to $Ar^{11}$ each independently represent an aromatic hydrocarbon group or an aromatic heterocyclic group which may have substituents. Further examples of the ligands represented by Q and Q' include benzoazoles such as derivatives of benzimidazole, benzothiazole and benzoxazole.

Further examples of the ligands represented by Q and Q' include ligands represented by the following general formula (9):

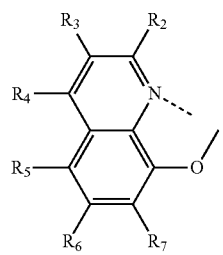     (9)

wherein $R_2$ to $R_7$ each independently represent hydrogen atom, a halogen atom, an hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxyl group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted aryloxycarbonyl group or carboxyl group. Among $R_2$ to $R_7$, any couple may be combined to form a ring.

Concrete examples of the groups represented by the foregoing $R_2$ to $R_7$ include those which will be described below.

Examples of the halogen atom represented by $R_2$ to $R_7$ in general formula (9) include fluorine atom, chlorine atom, bromine atom and iodine atom.

The amino group represented by $R_2$ to $R_7$ in general formula (9), which may be substituted, is a group represented by $-NX^1X^2$. Examples of the atom and the group which $X^1$ and $X^2$ each independently represent include hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitro-ethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methyl-pyrrol-5-yl group, 3-methylpyrrol-1-yl group, 3-methyl-pyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or unsubstituted alkyl group described above include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triamino-propyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyano-propyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or unsubstituted alkenyl group described above include vinyl group, aryl group, 1-butenyl group, 2-butenyl group, 3-butenyl group, 1,3-butadienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or unsubstituted cycloalkyl group described above include cyclopropyl group, cyclobutyl group, cyclopentyl group, cyclohexyl group and 4-methylcyclohexyl group.

The substituted or unsubstituted alkoxyl group described above is represented by —OY. Examples of the group represented by Y include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyano-propyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or unsubstituted aromatic hydrocarbon group described above include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4''-t-butyl-p-terphenyl-4-yl group.

Examples of the substituted or unsubstituted aromatic heterocyclic group described above include 1-pyrrolyl group, 2-pyrrolyl group, 3-pyrrolyl group, pyradinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-'7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methyl-pyrrol-5-yl group, 3-methylpyrrol-1-yl group, 3-methylpyrrol-2-yl group, 3-methylpyrrol-4-yl group, 3-methylpyrrol-5-yl group, 2t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or unsubstituted aralkyl group described above include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthyl-ethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or unsubstituted aryloxyl group described above is represented by —OZ'. Examples of the group represented by Z' include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4''-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzo-furanyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methyl-pyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The substituted or unsubstituted alkoxycarbonyl group described above is represented by —COOY. Examples of the group represented by Y include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the divalent group in the cyclic structure formed by the bonding of the adjacent groups represented by $R_2$ to $R_7$ include tetramethylene group, pentamethylene group, hexamethylene group, diphenylmethan-2,2'-diyl group, diphenylethan-3,3'-diyl group and diphenylpropan-4,4'-yl group.

Examples of the substituent to the groups represented by $R_2$ to $R_7$ in general formula (9) include a hydrogen atom, a halogen atom, an hydroxyl group, an amino group, a nitro group, a cyano group, alkyl groups, alkenyl groups, cycloalkyl groups, alkoxyl groups, aromatic hydrocarbon groups, aromatic heterocyclic groups, aralkyl groups, aryloxyl groups and alkoxycarbonyl groups and carboxyl group. Specific examples are the same as the foregoing description.

Specific preferable examples of the metallic complex with a ring having nitrogen atom are the metallic complexes coordinated with a single kind of derivatives with a ring having nitrogen atom, and the ring having nitrogen atom is preferably quinoline, phenylpyridine, benzquinoline or phenanthroline. Further, it is preferable that the metallic complex is metallic complex of quinolinol or its derivative. Examples of the metallic complex having ligands of 8-quinolinol derivative include tris(8-quinolinol)aluminum complex, tris(5,7-dichloro-8-quinolinol)aluminum complex, tris(5,7-dibromo-8-quinolinol)aluminum complex, tris(2-methyl-8-quinolinol)aluminum complex, tris(5-methyl-8-quinolinol)aluminum complex, tris(8-quinolinol)zinc complex, tris(8-quinolinol)indium complex, tris(8-quinolinol)magnesium complex, tris(8-quinolinol)copper complex, tris(8-quinolinol)calcium complex, tris(8-quinolinol)tin complex, tris(8-quinolinol)gallium complex, tris(8-quinolinol)lead complex, and so on each employed singly or in combination of two or more.

These metallic complexes are superior in electron injecting capability from the cathode because their energy gaps are small, superior in durability of electron transporting and enable to provide the EL device of long lifetime.

Examples of the compound with a ring structure and having nitrogen atom which is preferably employed as the electron transporting material include a compound with rings of pyridine, quinoline, pyrazine, pyrimidine, quinoxaline, triazine, imidazole and imidazopyridine. A compound obtained by coupling a ring having nitrogen atom with a condensed aromatic ring or a compound obtained by coupling a ring having nitrogen atom through an arylene group with a condensed aromatic ring is particularly preferable because it is possible to decrease the energy gap. The ring having nitrogen atom, the condensed aromatic ring or the arylene group may be substituted, for example, with hydrogen atom, halogen atom, hydroxyl group, amino group, nitro group, cyano group, alkyl group, alkenyl group, cycloalkyl group, alkoxyl group, aromatic hydrocarbon group, aromatic heterocyclic group, aralkyl group, aryloxy group, alkoxycarbonyl group, carboxyl group, etc.

Further, preferable examples of the foregoing condensed aromatic ring include naphthalene, anthracene, pyrene, phenanthrene, fluoranthene, chrysene, perylene, naphthacene or pentacene, etc.

The more preferable example of the compound with a ring having nitrogen atom as the electron transporting material described above is a condensed compound of the six-membered ring and the five-membered ring each having imidazole ring or such as imidazopyridine or benzimidazole, each having 1 to 4 nitrogen atoms. Example of the above condensed ring with benzimidazole structure is a compound represented by the following general formula (A) or (B):

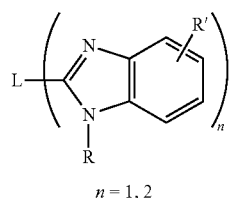

(A)

$n = 1, 2$

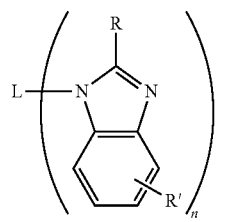

(B)

$n = 1, 2$ wherein L represents a monovalent group or a linking group having a functionality of two or greater, examples of which include carbon atom, silicon atom, nitrogen atom, boron atom, oxygen atom, sulfur atom, metals such as barium and beryllium, aromatic hydrocarbon groups and aromatic heterocyclic groups. Among these atoms and groups, carbon atom, nitrogen atom, silicon atom, boron atom, oxygen atom, sulfur atom, aromatic hydrocarbon groups and aromatic heterocyclic groups are preferable, and carbon atom, silicon atom, aromatic hydrocarbon groups and aromatic heterocyclic groups are more preferable.

The aromatic hydrocarbon group and the aromatic heterocyclic group represented by the foregoing formula (A) or (B) may have substituents. As the substituent, alkyl groups, alkenyl groups, alkynyl groups, aromatic hydrocarbon groups, amino group, alkoxyl groups, aryloxyl groups, acyl groups, alkoxycarbonyl groups, aryloxycarbonyl groups, acyloxy groups, acylamino groups, alkoxycarbonylamino groups, aryloxycarbonylamino groups, sulfonylamino groups, sulfamoyl groups, carbamoyl groups, alkylthio groups, alkylthio groups, arylthio groups, sulfonyl group, halogen atoms, cyano group and aromatic heterocyclic groups are preferable. Alkyl groups, aryl groups, alkoxyl groups, aryloxyl groups, halogen atoms, cyano group and aromatic heterocyclic group are more preferable. Alkyl groups, aryl groups, alkoxyl groups, aryloxyl groups and aromatic heterocyclic groups are still more preferable, and alkyl groups, aryl groups, alkoxyl groups and aromatic heterocyclic groups are most preferable.

When the group represented by L in general formula (A) or (B) is monovalent, groups represented by -L'-Ar$^1$-Ar$^2$ are preferable as the group represented by L. Examples of the above group include residues of condensed aromatic ring such as anthracene, naphthalene, chrysene, phenanthrene, fluoranthene, pyrene, perylene; aromatic heterocyclic group such as pyridine, pyrimidine, triazine; or uncondensed aromatic ring such as benzene, biphenyl, terphenyl, etc. These residues may be substituted, and L' may represent single bond. Ar$^1$ represents preferably, in particular, anthracene residue, naphthalene residue or chrysene residue, Ar$^2$ represents preferably, in particular, naphthalene residue, biphenyl residue or benzene residue.

Specific examples of the group represented by general formula (A) or (B) include the groups shown in the following; however, they are not limited to the following. In the following groups, the residue group of the five-membered cyclic derivative having nitrogen atom shown among the parenthesis ( ) in general formula (A) or (B) is represented by HAr.

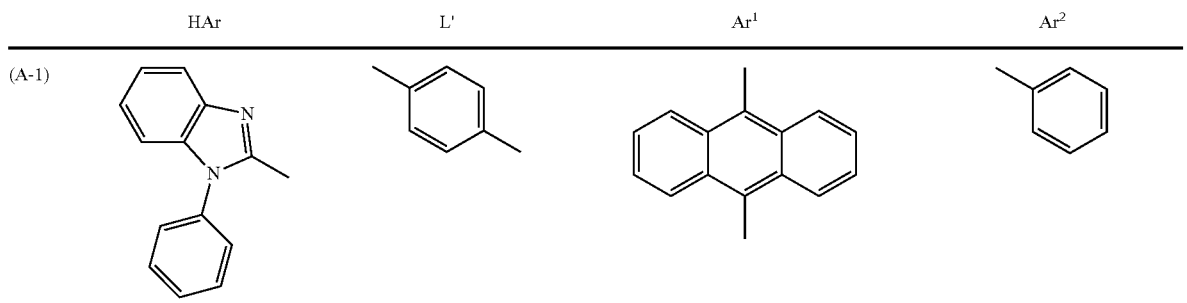

-continued
| | HAr | L' | Ar¹ | Ar² |
|---|---|---|---|---|
| (A-2) | 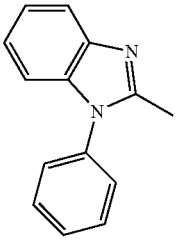 | 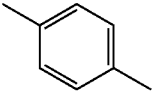 | 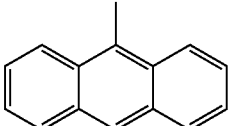 | 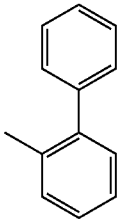 |
| (A-3) | 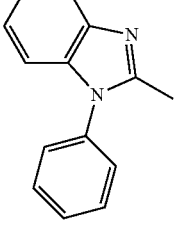 | 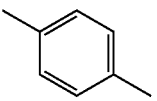 | 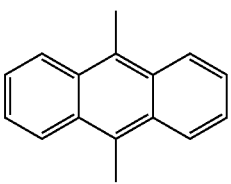 | 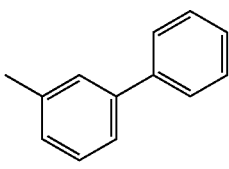 |
| (A-4) | 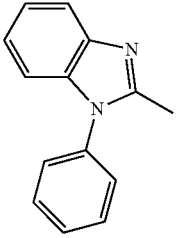 | 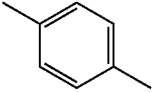 | 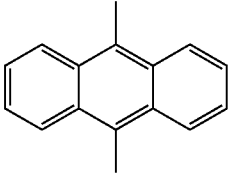 | 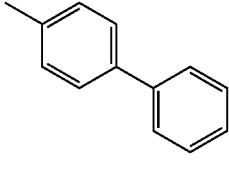 |
| (A-5) | 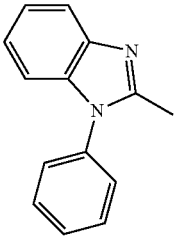 | 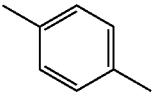 | 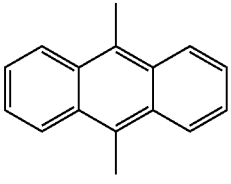 | 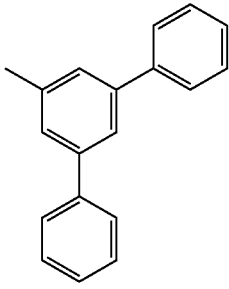 |
| (A-6) | 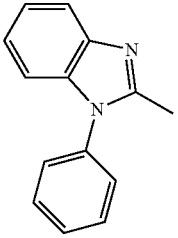 | 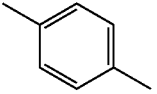 | 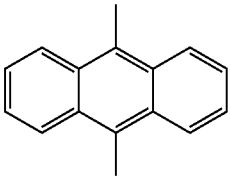 | 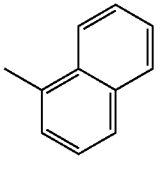 |
| (A-7) | 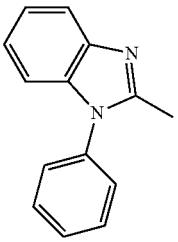 | 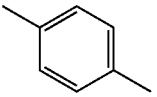 | 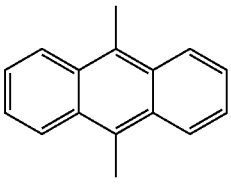 | 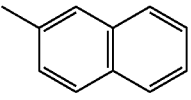 |

-continued
| | HAr | L' | Ar¹ | Ar² |
|---|---|---|---|---|
| (A-8) | 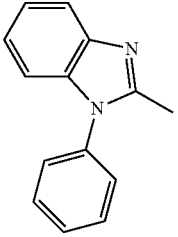 | 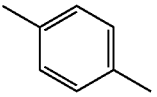 | 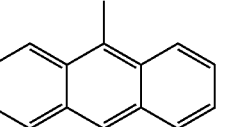 | 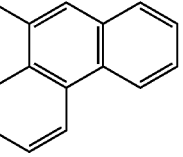 |
| (A-9) | 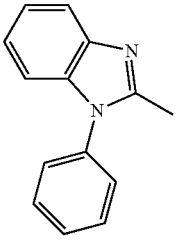 | 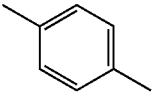 | 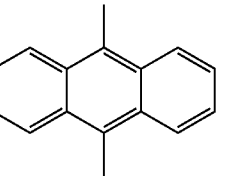 | 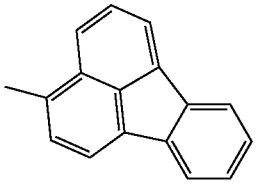 |
| (A-10) | 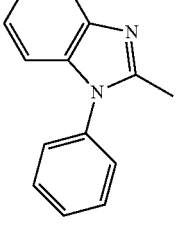 | 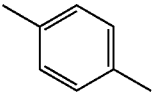 | 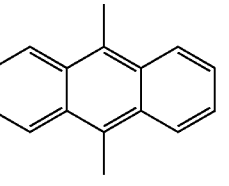 | 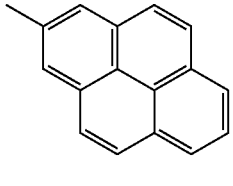 |
| (A-11) | 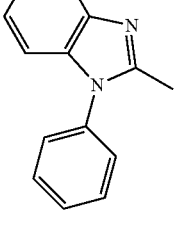 | 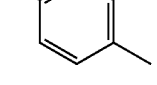 | 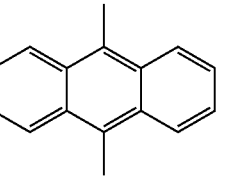 | 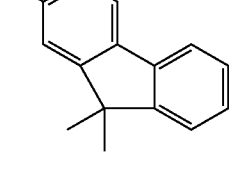 |
| (A-12) | 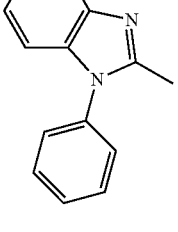 | 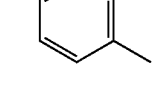 | 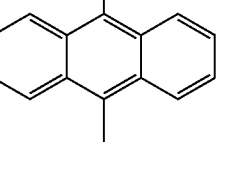 | 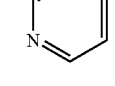 |
| (A-13) | 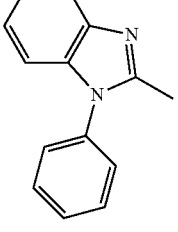 | 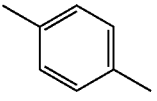 | 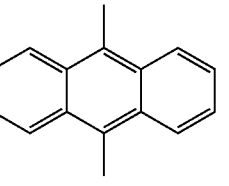 | 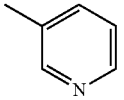 |

HAr—L'—Ar¹—Ar²

| | HAr | L' | Ar¹ | Ar² |
|---|---|---|---|---|
| (A-14) | | | | |
| (A-15) | | | | |
| (A-16) | | | | |
| (A-17) | | | | |
| (A-18) | | | | |
| (A-19) | | | | |

-continued
| HAr | L' | Ar¹ | Ar² |
|---|---|---|---|
| (A-20) 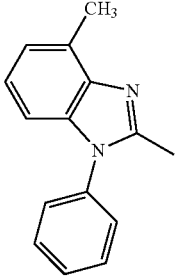 | 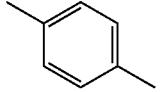 | 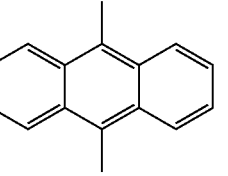 | 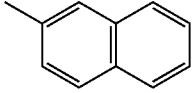 |
| (A-21) 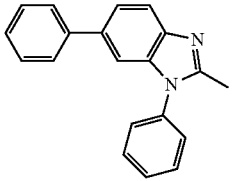 | 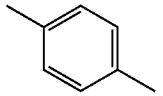 | 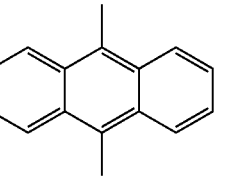 | 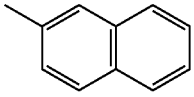 |
| (A-22) 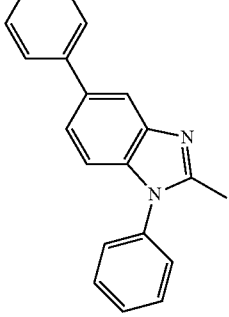 | 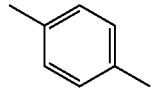 | 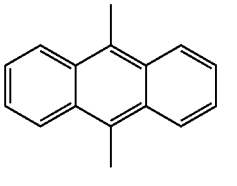 | 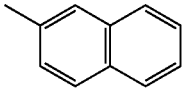 |
| (A-23) 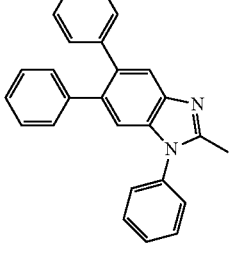 | 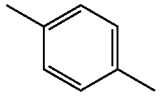 | 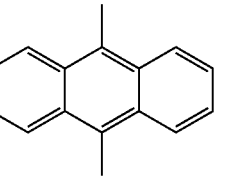 | 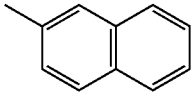 |
| (A-24) 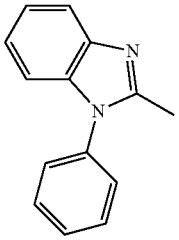 | | 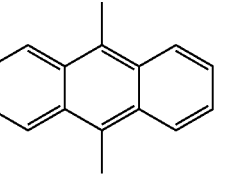 | 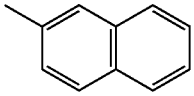 |

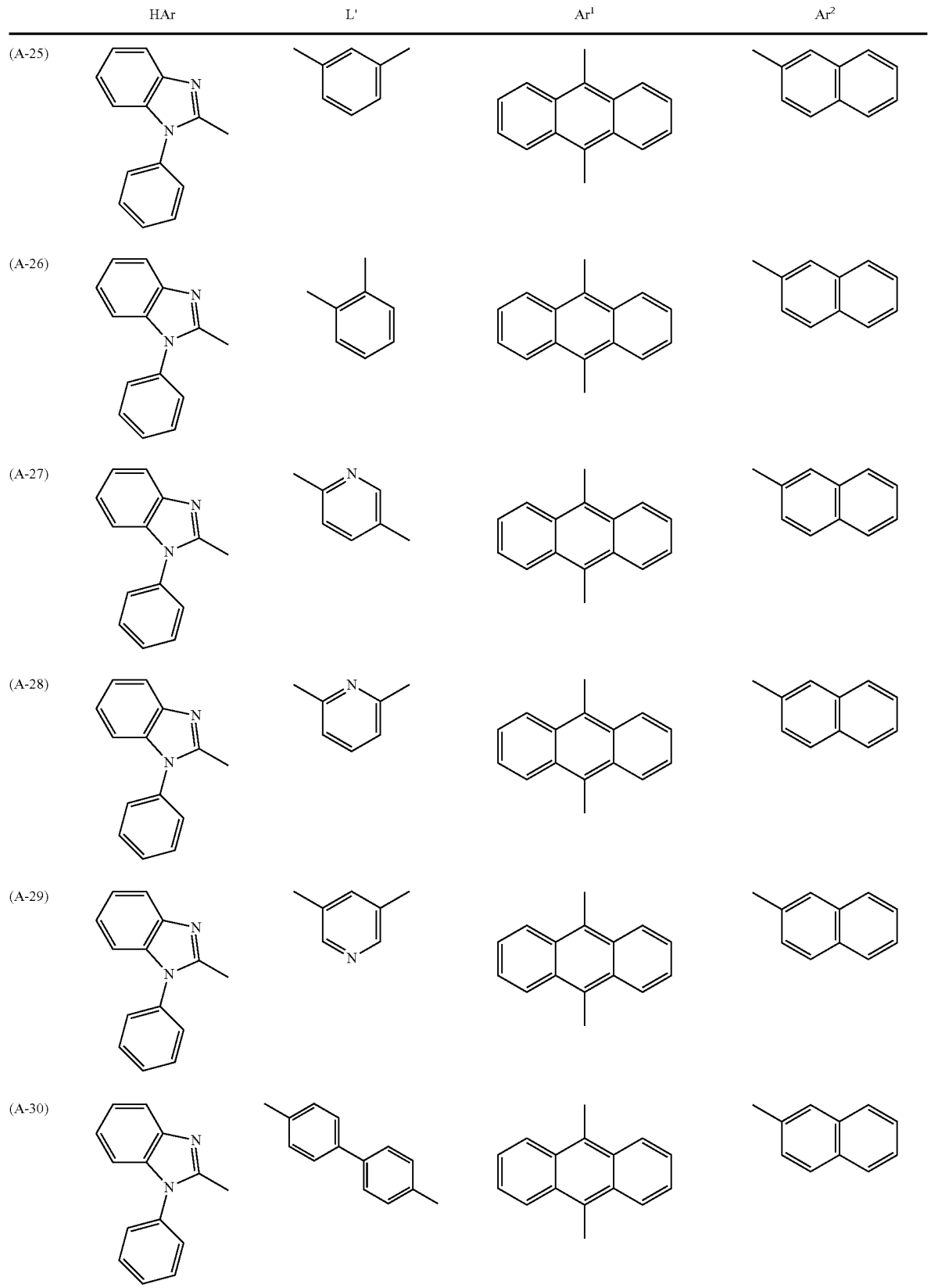

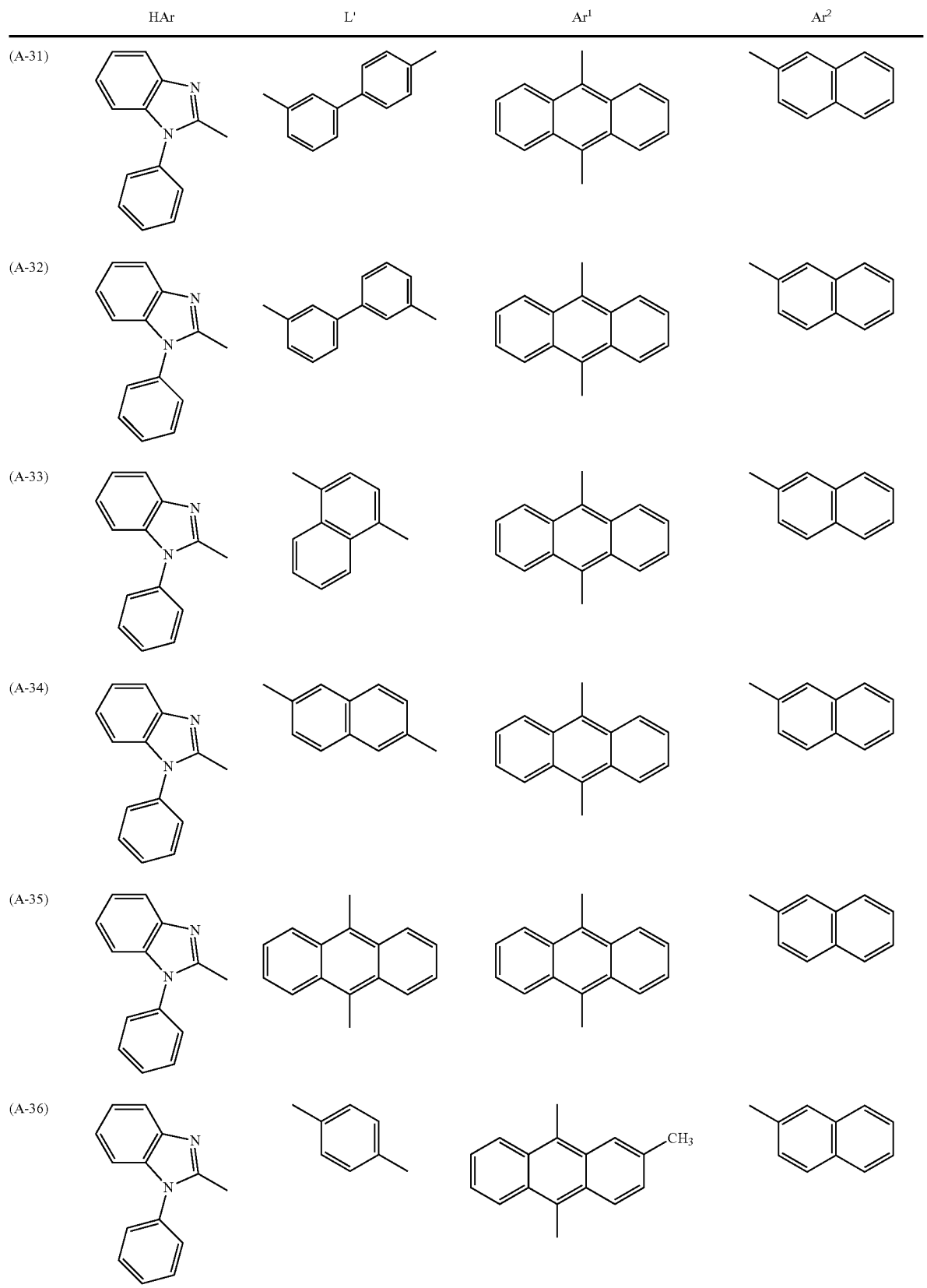

-continued
| | HAr | L' | Ar¹ | Ar² |
|---|---|---|---|---|
| (A-37) | 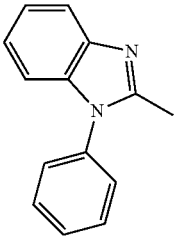 | 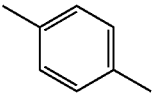 | 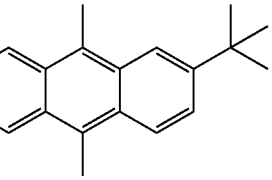 | 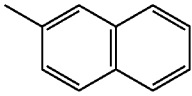 |
| (A-38) | 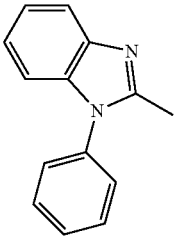 | 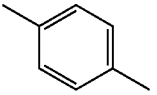 | 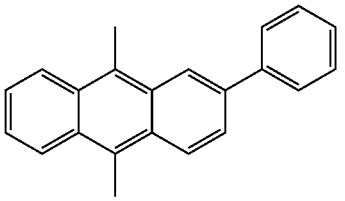 | 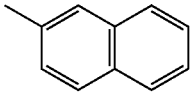 |
| (A-39) | 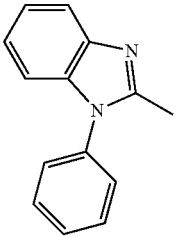 | 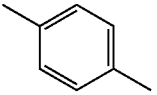 | 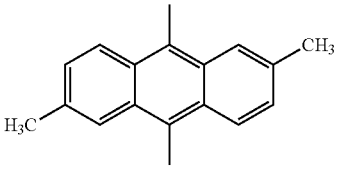 | 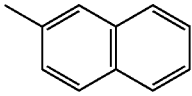 |
| (A-40) | 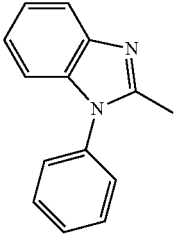 | 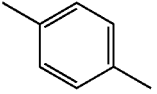 | 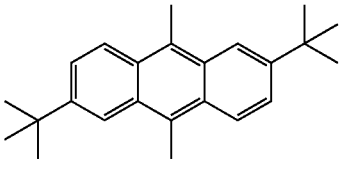 | 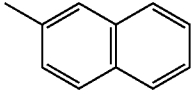 |
| (A-41) | 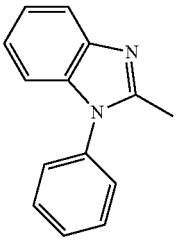 | 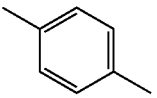 | 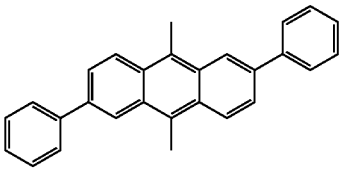 | 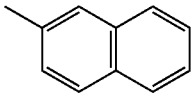 |
| (B-1) | 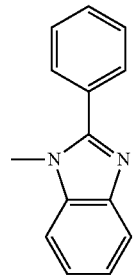 | 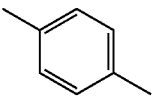 | 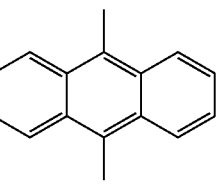 | 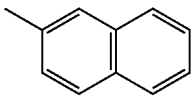 |

| HAr—L'—Ar¹—Ar² | | | |
|---|---|---|---|
| HAr | L' | Ar¹ | Ar² |
| (B-2) | | | |
| (B-3) | | | |

When L represents a linking group having a functionality of two or greater, general formula (A) or (B) is preferably represented by HAr-L'-Ar¹-L'-HAr having a functionality of two or greater. Preferable examples of L' or Ar¹ is the same as the above examples, which may be substituted, and L' may be single bonded.

R or R' represents hydrogen atom, an aliphatic hydrocarbon group, an aromatic hydrocarbon group or a heterocyclic group.

The aliphatic hydrocarbon group represented by R or R' is a linear, branched or cyclic alkyl group (an alkyl group preferably having 1 to 20 carbon atoms, more preferably having 1 to 12 carbon atoms and most preferably having 1 to 8 carbon atoms, such as methyl group, ethyl group, isopropyl group, t-butyl group, n-octyl group, n-decyl group, n-hexadecyl group, cyclopropyl group, cyclopentyl group and cyclohexyl group), an alkenyl group (an alkenyl group preferably having 2 to 20 carbon atoms, more preferably having 2 to 12 carbon atoms and most preferably having 2 to 8 carbon atoms, such as vinyl group, aryl group, 2-butenyl group and 3-pentenyl group), or an alkynyl group (an alkynyl group preferably having 2 to 20 carbon atoms, more preferably having 2 to 12 carbon atoms and most preferably having 2 to 8 carbon atoms, such as propargyl group and 3-pentynyl group). An alkyl group is preferable among these groups.

The aromatic hydrocarbon group represented by R or R' is a group having a single ring or a condensed ring, which is an aromatic hydrocarbon group preferably having 6 to 30 carbon atoms, more preferably having 6 to 20 carbon atoms and most preferably having 6 to 12 carbon atoms, such as phenyl group, 2-methylphenyl group, 3-methylphenyl group, 4-methylphenyl group, 2-methoxyphenyl group, 3-trifluoromethylphenyl group, pentafluorophenyl group, 1-naphthyl group and 2-naphthyl group.

The heterocyclic group represented by R or R' has a single ring or a condensed ring, preferably has 1 to 20 carbon atoms, more preferably having 1 to 12 carbon atoms and most preferably having 2 to 10 carbon atoms and is preferably an aromatic heterocyclic group having at least one of nitrogen atom, oxygen atom, sulfur atom and selenium atom. Examples of the heterocyclic group include groups derived from pyrrolidine, piperidine, piperazine, morpholine, thiophene, selenophene, furan, pyrrol, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthylidine, quinoxaline, quinazoline, cinnoline, puteridine, acridine, phenanthroline, phenazine, tetrazole, benzimidazole, benzoxazole, benzothiazole, benzotriazole, tetrazaindene, carbazole and azepine. Groups derived from furan, thiophene, pyridine, pyrazine, pyrimidine, pyridazine, triazine, quinoline, phthalazine, naphthylidine, quinoxaline and quinazoline are preferable, and groups derived from quinoline are more preferable.

The aliphatic hydrocarbon group, the aromatic hydrocarbon group and the heterocyclic group which are represented by R or R' may have substituents. Examples of the substituent include the substituents described as the examples of the substituent to the group represented by L. Preferable examples of the substituent include the substituents described as the preferable examples of the substituent to the group represented by L.

It is preferable that R or R' represents an aliphatic hydrocarbon group, an aromatic hydrocarbon group or a heterocyclic group. It is more preferable that R or R' represents an aliphatic hydrocarbon group (preferably having 6 to 30 carbon atoms, more preferably having 6 to 20 carbon atoms and most preferably having 6 to 12 carbon atoms) or an aromatic hydrocarbon. It is most preferable that R or R' represents an aliphatic hydrocarbon group (preferably having 1 to 20 carbon atoms, more preferably having 1 to 12 carbon atoms and most preferably having 2 to 10 carbon atoms).

n represents an integer of one or two.

Further, among the compounds with a ring structure and having nitrogen atom as the electron transporting material, those with imidazopyridine structure are represented by following general formula (C).

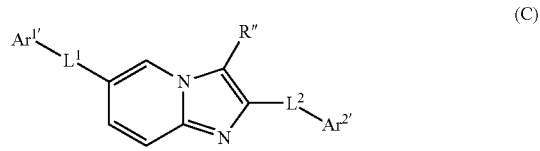

(C)

In the above general formula (C), $Ar^{1'}$ represents a substituted or unsubstituted aryl group having 6 to 60 nuclear carbon atoms (preferably having 6 to 40 nuclear carbon atoms) or a substituted or unsubstituted heteroaryl group having 3 to 60 nuclear carbon atoms (preferably having 3 to 40 nuclear carbon atoms).

Examples of the substituted or unsubstituted aryl group represented by $Ar^{1'}$ include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-chrysenyl group, 2-chrysenyl group, 6-chrysenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4''-t-butyl-p-terphenyl-4-yl group, fluoranthenyl group, fluorenyl group, monovalent groups having the spirofluorene structure, perfluorophenyl group, perfluoronaphthyl group, perfluoroanthryl group, perfluorobiphenylyl group, monovalent groups having the 9-phenylanthancene structure, monovalent groups having the 9-(1'-naphthyl)anthracene structure, monovalent groups having the 9-(2'-naphthyl)anthracene structure, monovalent groups having the 6-phenylchrysene structure and monovalent groups having the 9-[4-(diphenylamino)phenyl]anthracene structure. Among these groups, phenyl group, naphthyl groups, biphenyl groups, terphenyl groups, 9-(10-phenyl)anthryl group, 9-[10-(1'-naphthyl)]anthryl group and 9-[10-(2'-naphthyl)]anthryl group are preferable.

Examples of the substituted or unsubstituted heteroaryl group represented by $Ar^{1'}$ include pyrrolyl group, furyl group, thienyl group, silacyclopentadienyl group, pyridyl group, quinolyl group, isoquinolyl group, benzofuryl group, imidazolyl group, pyrimidyl group, carbazolyl group, selenophenyl group, oxadiazolyl group and triazolyl group. Among these groups, pyridyl group, quinolyl group and isoquinolyl group are preferable.

In general formula (C), $Ar^{2'}$ represents hydrogen atom, a substituted or unsubstituted aryl group having 6 to 60 nuclear carbon atoms (preferably having 6 to 40 nuclear carbon atoms), a substituted or unsubstituted heteroaryl group having 3 to 60 nuclear carbon atoms (preferably having 3 to 40 nuclear carbon atoms), a substituted or unsubstituted alkyl group having 1 to 20 nuclear carbon atoms (preferably having 1 to 6 carbon atoms) or a substituted or unsubstituted alkoxyl group having 1 to 20 nuclear carbon atoms (preferably having 1 to 6 carbon atoms).

Examples of the substituted or unsubstituted aryl group represented by $Ar^{2'}$ include the groups described above as the examples of the substituted or unsubstituted aryl group represented by Arr.

Examples of the substituted or unsubstituted heteroaryl group represented by $Ar^{2'}$ include the groups described above as the examples of the substituted or unsubstituted heteroaryl group represented by $Ar^{1'}$.

Examples of the substituted or unsubstituted alkyl group represented by $Ar^{2'}$ include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, cyclopropyl group, cyclobutyl group, cyclopentyl group, cyclohexyl group, 4-methylcyclohexyl group, 1-adamantyl group, 2-adamantyl group, 1-norbornyl group and 2-norbornyl group. Among these groups, methyl group, ethyl group and t-butyl group are preferable.

In general formula (C), the substituted or unsubstituted alkoxyl group represented by $Ar^{2'}$ is a group represented by —OY. Examples of the group represented by Y include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group. Among these groups, methyl group, ethyl group and t-butyl group are preferable.

In general formula (C), at least one of the groups represented by $Ar^{1'}$ and $Ar^{2'}$ is a substituted or unsubstituted condensed cyclic group having 10 to 60 nuclear carbon atoms or a substituted or unsubstituted condensed mono-heterocyclic group having 3 to 60 nuclear carbon atoms.

In general formula (C), $L^1$ and $L^2$ each independently represent the single bond, a substituted or unsubstituted arylene group having 6 to 60 nuclear carbon atoms (preferably having 6 to 40 nuclear carbon atoms), a substituted or unsubstituted heteroarylene group having 3 to 60 nuclear carbon atoms (preferably having 3 to 40 nuclear carbon atoms) or a substituted or unsubstituted fluorenylene group.

Examples of the substituted or unsubstituted arylene group represented by $L^1$ or $L^2$ include divalent groups formed by removing hydrogen atom from the aryl groups described above as the examples of the substituted or unsubstituted aryl group represented by the above $Ar^{1'}$.

Examples of the substituted or unsubstituted heteroarylene group represented by $L^1$ or $L^2$ include divalent groups formed by removing hydrogen atom from the heteroaryl groups described above as the examples of the substituted or unsubstituted heteroaryl group represented by the above $Ar^{1'}$.

In general formula (C), it is preferable that $L^1$ and/or $L^2$ represent a group selected from the group consisting of the following:

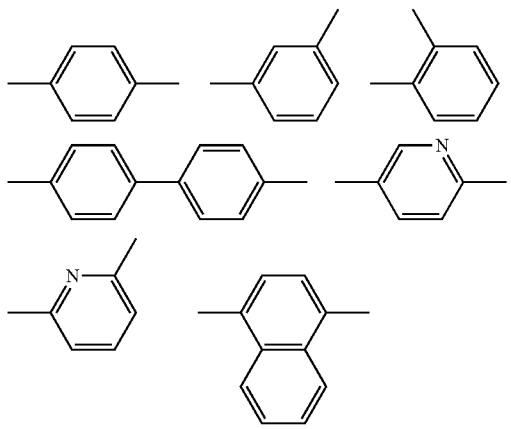

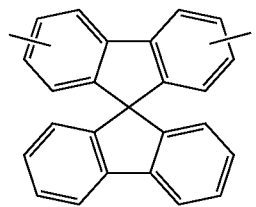

It is preferable that, in general formula (C), $Ar^{1'}$ represents a group represented by one of the following general formulae (a) to (j):

(a)

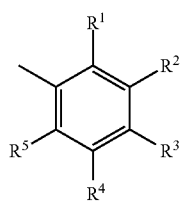

(b)

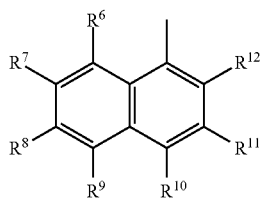

(c)

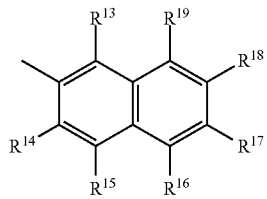

(d)

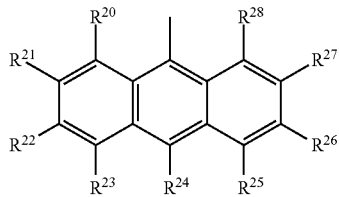

(e)

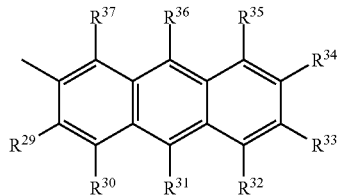

-continued

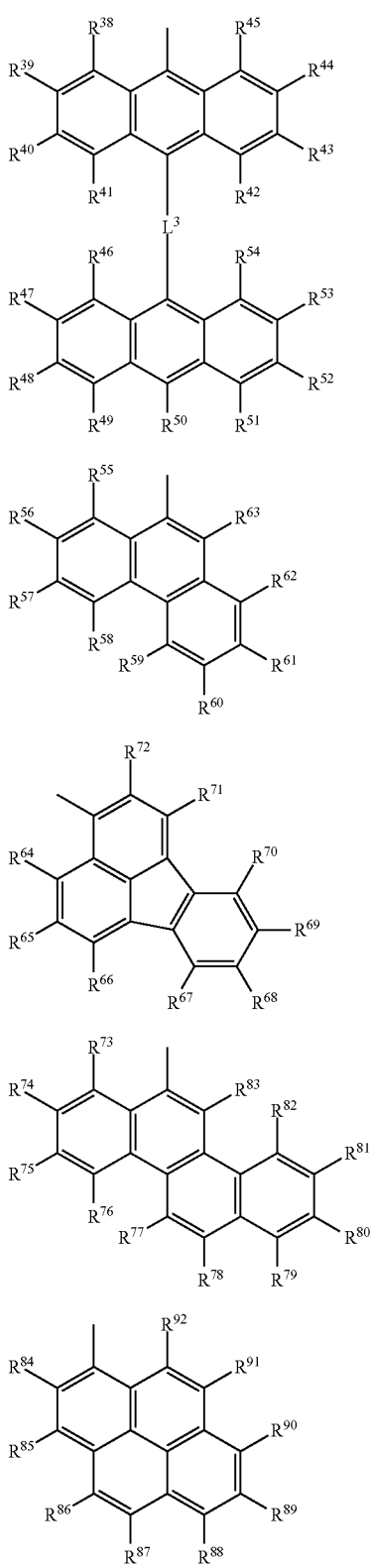

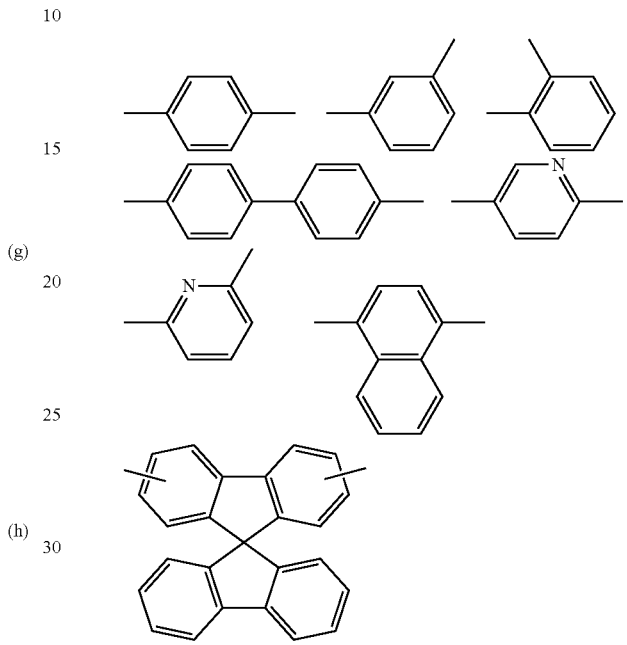

wherein $R^1$ to $R^{92}$ each independently represent hydrogen atom, a halogen atom, a substituted or unsubstituted alkyl group having 1 to 20 carbon atoms, a substituted or unsubstituted alkoxyl group having 1 to 20 carbon atoms, a substituted or unsubstituted aryloxyl group having 6 to 40 nuclear carbon atoms, a substituted or unsubstituted diarylamino group having 12 to 80 nuclear carbon atoms, a substituted or unsubstituted aryl group having 6 to 40 nuclear carbon atoms, a substituted or unsubstituted heteroaryl group having 3 to 40 nuclear carbon atoms or a substituted or unsubstituted diarylamino group having 18 to 120 nuclear carbon atoms, and $L^3$ represents the single bond or a group selected from the following groups:

In the foregoing general formula (C), R" represents hydrogen atom, a substituted or unsubstituted aryl group having 6 to 60 nuclear carbon atoms, a substituted or unsubstituted heteroaryl group having 3 to 60 nuclear carbon atoms, a substituted or unsubstituted alkyl group having 1 to 20 carbon atoms or a substituted or unsubstituted alkoxyl group having 1 to 20 carbon atoms.

Examples of the substituted or unsubstituted aryl group represented by R" include the groups described above as the examples of the substituted or unsubstituted aryl group represented by the foregoing $Ar^{1'}$.

Examples of the substituted or unsubstituted heteroaryl group represented by R" include the groups described above as the examples of the substituted or unsubstituted heteroaryl group represented by the foregoing $Ar^1$.

Examples of the substituted or unsubstituted alkyl group represented by R" include the groups described above as the examples of the substituted or unsubstituted alkyl group represented by the foregoing $Ar^{2'}$.

Examples of the substituted or unsubstituted alkoxyl group represented by R" include the groups described above as the examples of the substituted or unsubstituted alkoxyl group represented by the foregoing $Ar^{2'}$.

It is preferable that the five-membered cyclic derivative with a ring having nitrogen atom which is represented by general formula (C) has one of the basic skeleton structures shown in the following as the examples. However, the basic skeleton structure is not limited to those shown as the example.

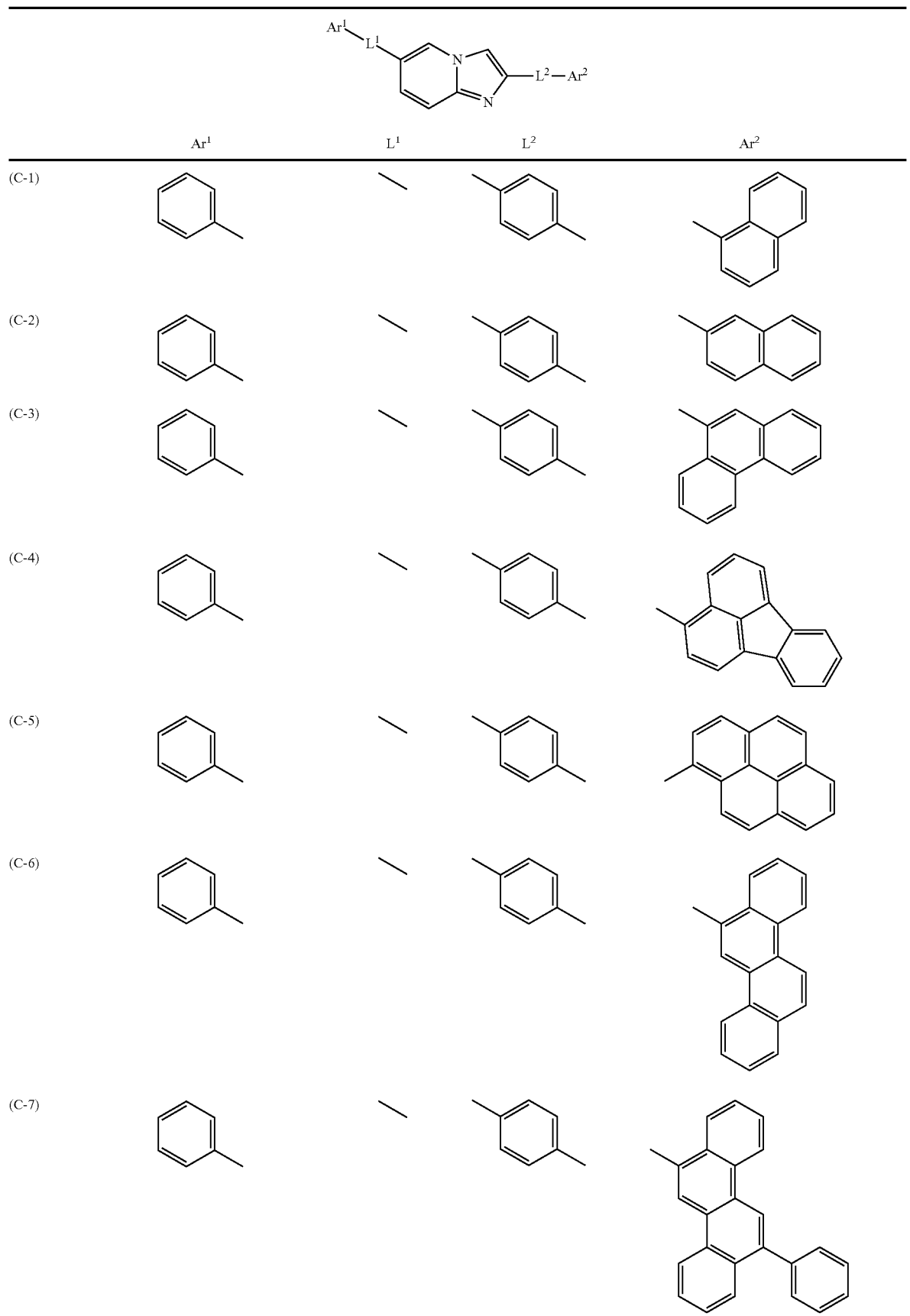

-continued
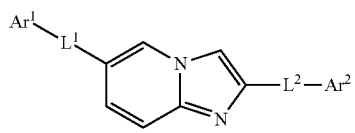
| | Ar¹ | L¹ | L² | Ar² |
|---|---|---|---|---|
| (C-8) | phenyl | — | p-phenylene | 9,9-dimethylfluorenyl |
| (C-9) | phenyl | — | p-phenylene | 10-phenylanthracen-9-yl |
| (C-10) | phenyl | — | p-phenylene | 10-(biphenyl-2-yl)anthracen-9-yl |
| (C-11) | phenyl | — | p-phenylene | 10-(biphenyl-3-yl)anthracen-9-yl |
| (C-12) | phenyl | — | p-phenylene | 10-(biphenyl-4-yl)anthracen-9-yl |

-continued
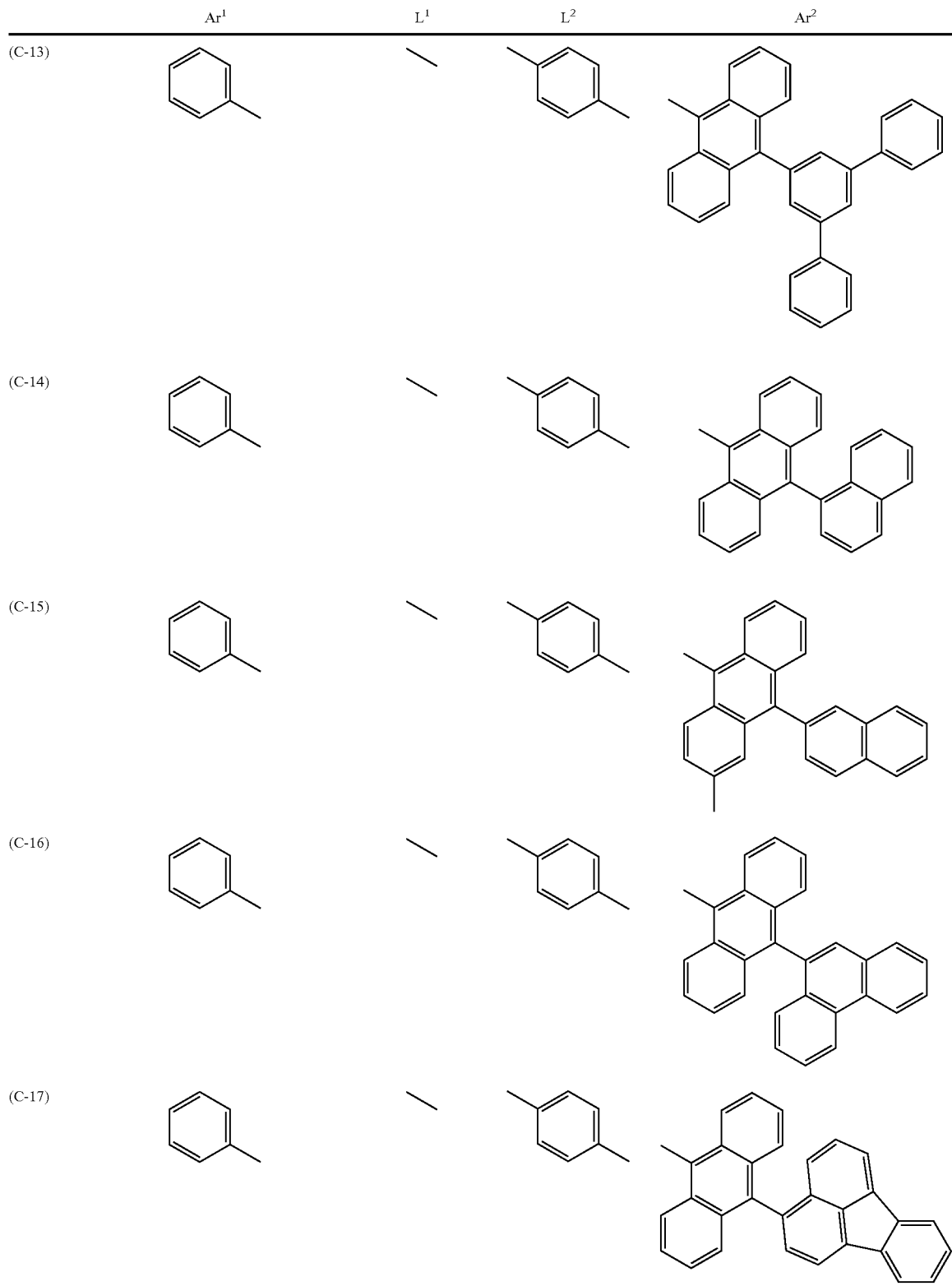

-continued
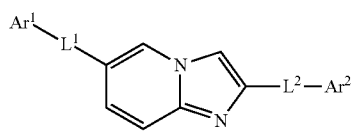
| | Ar¹ | L¹ | L² | Ar² |
|---|---|---|---|---|
| (C-18) | 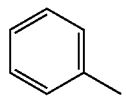 | — | 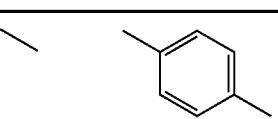 | 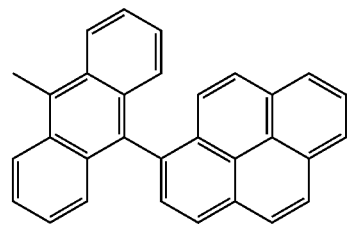 |
| (C-19) | 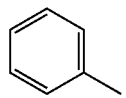 | — | 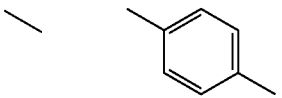 | 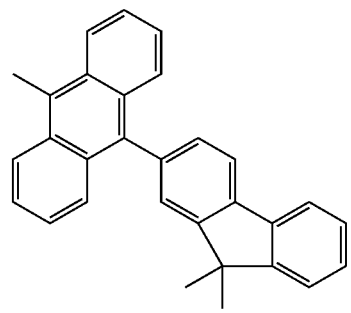 |
| (C-20) | 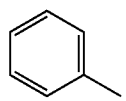 | — | 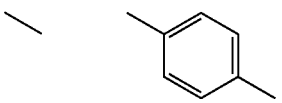 | 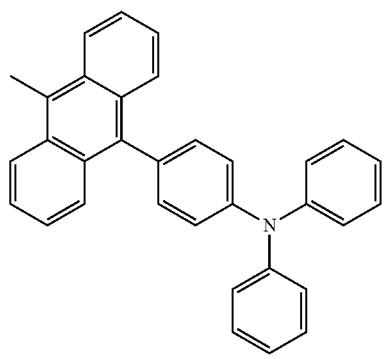 |
| 3-1 | 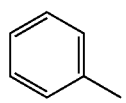 | — | 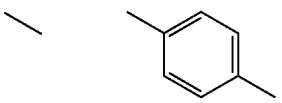 | 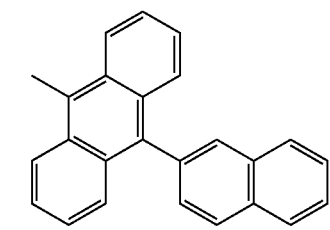 |
| (C-21) | 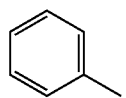 | — | 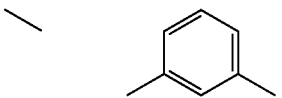 | 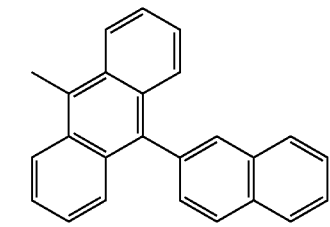 |

-continued
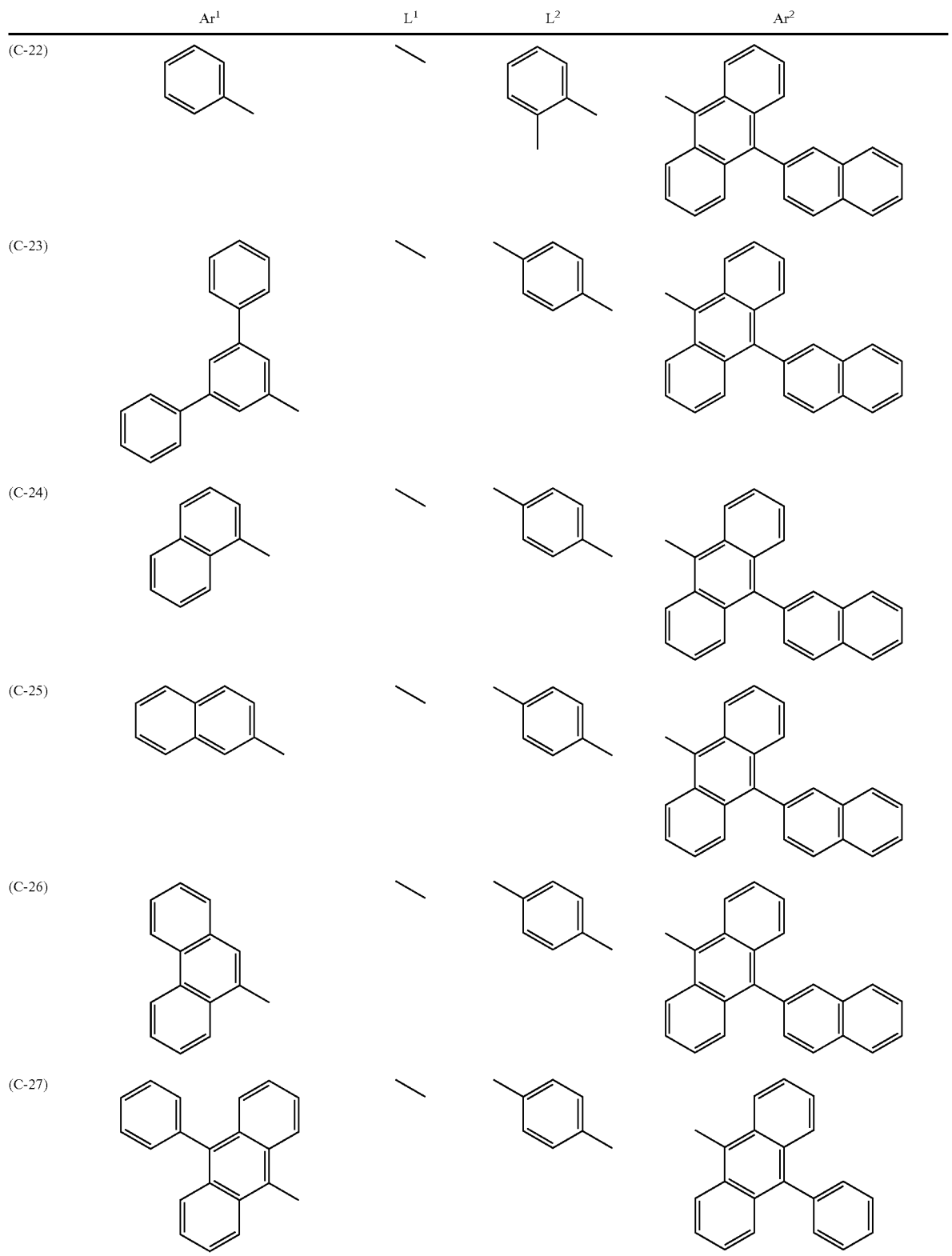

-continued
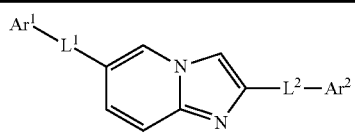
| | Ar¹ | L¹ | L² | Ar² |
|---|---|---|---|---|
| (C-28) | 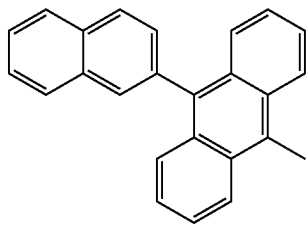 | — | 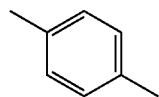 | 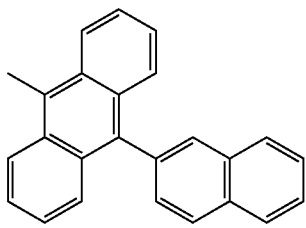 |
| (C-29) | 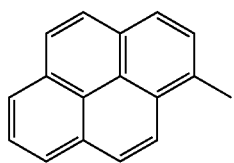 | — | 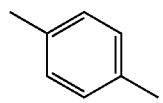 | 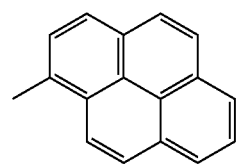 |
| (C-30) | 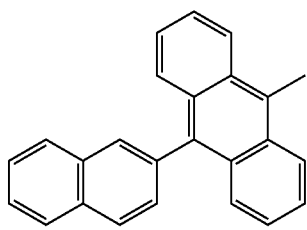 | 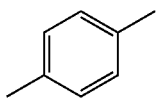 | — | 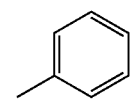 |
| (C-31) | 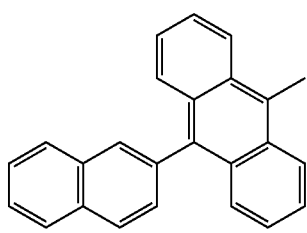 | 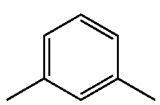 | — | 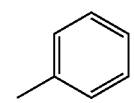 |
| (C-32) | 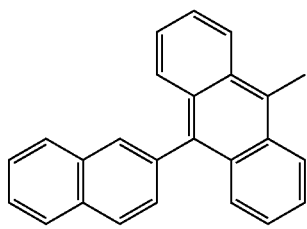 | 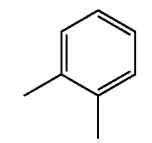 | — | 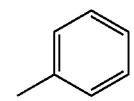 |
| (C-33) | 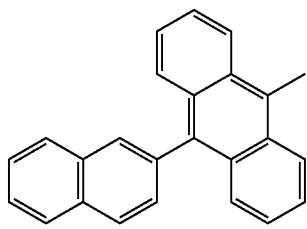 | 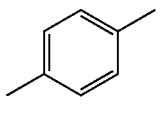 | — | 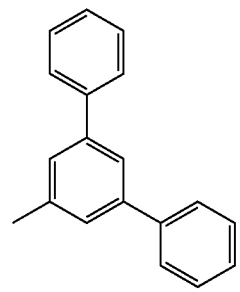 |

-continued
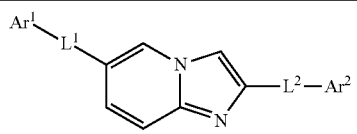
| | Ar¹ | L¹ | L² | Ar² |
|---|---|---|---|---|
| (C-34) | 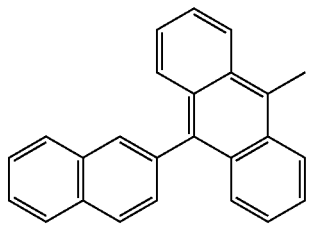 | 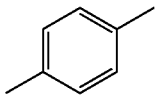 | — | 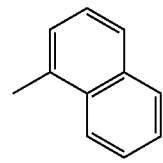 |
| (C-35) | 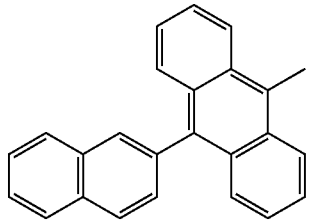 | 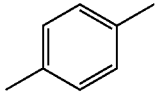 | — | 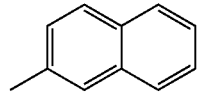 |
| (C-36) | 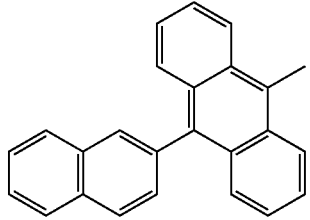 | 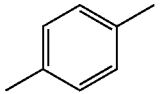 | — | 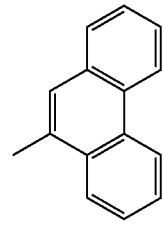 |
| (C-37) | 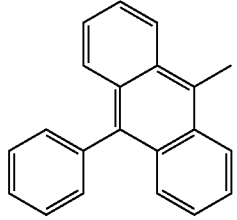 | 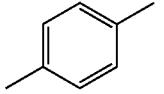 | — | 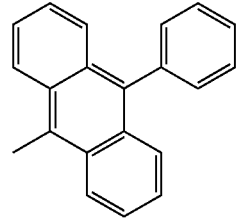 |
| (C-38) | 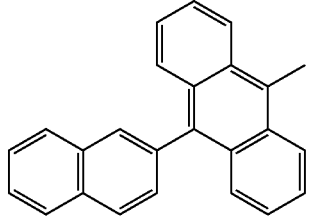 | 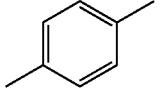 | — | 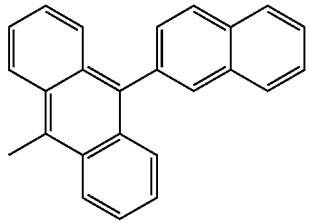 |
| (C-39) | 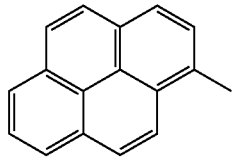 | 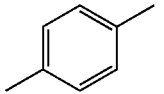 | — | 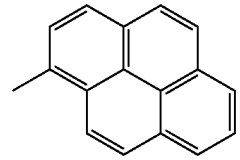 |

The compound with a ring having a nitrogen atom represented by the foregoing general formula (C) may have substituents. As the substituent, alkyl groups, alkenyl groups, alkynyl groups, aromatic hydrocarbon groups, amino group, alkoxyl groups, aryloxyl groups, acyl groups, alkoxycarbonyl groups, aryloxycarbonyl groups, acyloxyl groups, acylamino groups, alkoxycarbonylamino groups, aryloxycarbonylamino groups, sulfonylamino groups, sulfamoyl groups, carbamoyl groups, alkylthio groups, alkylthio groups, arylthio groups, sulfonyl group, halogen atoms, cyano group and aromatic heterocyclic groups are preferable. Alkyl groups, aryl groups, alkoxyl groups, aryloxyl groups, halogen atoms, cyano group and aromatic heterocyclic group are more preferable. Alkyl groups, aryl groups, alkoxyl groups, aryloxyl groups and aromatic heterocyclic groups are still more preferable, and alkyl groups, aryl groups, alkoxyl groups and aromatic heterocyclic groups are most preferable.

These compounds with a ring having a nitrogen atom are superior in electron injecting capability from the cathode because their energy gaps are small, superior in durability of electron transporting and enable to provide the EL device of long lifetime.

In the present invention, it is preferable that the reductive dopant is added in either the electron injecting layer or the interfacial zone between the cathode and the layer adhered to the cathode, and that the work function of the reductive dopant is 2.9 eV or smaller. The reductive dopant used in the present invention is defined as a compound which is added to the interfacial zone between the electron injecting layer and the cathode and which enhances the effectiveness in electron injecting. At least a portion of the organic layer comprised in the interfacial zone is reduced to form anions.

As for the addition form of the reductive dopant; it is preferable that the reductive dopant is added in a manner such that a layer or islands are formed in the interfacial zone described above.

Examples of the reductive dopant include at least one compound selected from alkali metals, alkali metallic complexes, alkali metal compounds, alkaline earth metals, alkaline earth metallic complexes, alkaline earth metal compounds, rare earth metals, rare earth metallic complexes and rare earth metal compounds. Examples of the alkali metal compound, the alkaline earth metal compound and the rare earth metal compound described above include oxides and halides of the respective metals.

Examples of the alkali metal include Na (the work function: 2.36 eV), K (the work function: 2.28 eV), Rb (the work function: 2.16 eV) and Cs (the work function: 1.95 eV). Alkali metals having a work function of 2.9 eV or smaller are preferable. Among these alkali metals, K, Rb and Cs are preferable, Rb and Cs are more preferable, and Cs is most preferable.

Examples of the alkaline earth metal include Ca (the work function: 2.9 eV), Sr (the work function: 2.0 to 2.5 eV) and Ba (the work function: 2.52 eV). Alkaline earth metals with a work function of 2.9 eV or smaller are preferable.

Examples of the rare earth metal include Sc, Y, Ce, Tb and Yb. Rare earth metals with a work function of 2.9 eV or smaller are preferable.

When the preferable metals among the above metals are used, the luminance of the emitted light and the lifetime of the organic EL device can be increased by addition of the metals into the electron injecting layer in a relatively small amount since these metals have great reducing ability.

Examples of the alkali metal compound described above include alkali metal oxides such as $Li_2O$, $Cs_2O$ and $K_2O$ and alkali metal halides such as LiF, NaF, CsF and KF. Among these compounds, alkali metal oxides and alkali metal fluorides such as LiF, $Li_2O$ and NaF are preferable.

Examples of the alkaline earth metal compound described above include BaO, SrO, CaO and mixtures thereof such as $Ba_xSr_{1-x}O$ (0<x<1) and $Ba_xCa_{1-x}O$ (0<x<1). Among these compounds, BaO, SrO and CaO are preferable.

Examples of the rare earth metal compound described above include $YbF_s$, $ScF_3$, $ScO_3$, $Y_2O_3$, $Ce_2O_3$, $GdF_s$ and $TbF_s$. Among these compounds, $YbF_s$, $ScF_s$ and $TbF3$ are preferable.

The alkali metallic complex, the alkaline earth metallic complex and the rare earth metallic complex are not particularly limited as long as the complexes contain at least one of the alkali metal ions, the alkaline earth metal ions and rare earth metal ions, respectively, as the metal ion. As the ligand, quinolinol, benzoquinolinol, acridinol, phenanthridinol, hydroxyphenyloxazole, hydroxyphenylthiazole, hydroxydiaryloxadiazoles, hydroxydiarylthiadiazoles, hydroxyphenylpyridine, hydroxyphenyl-benzimidazole, hydroxybenzotriazole, hydroxyflavone, bipyridyl, phenanthroline, phthalocyanine, porphyrin, cyclopentadiene, β-diketones, azomethines and derivatives of these compounds are preferable. However, the ligand is not limited to the ligands described above.

As the process for adding the reductive dopant, it is preferable that an organic material which is the light emitting material or the electron injecting material forming the interfacial zone is vaporized while the reductive dopant is simultaneously vapor deposited in accordance with the resistance heating deposition method so that the reductive dopant is dispersed in the organic material. The concentration of the dispersion expressed as the ratio of the amounts by mole of the organic substance to the reductive dopant is in the range of 100:1 to 1:100 and preferably in the range of 5:1 to 1:5.

When the reductive dopant is added to form a layer, the reductive dopant alone is vapor deposited in accordance with the resistance heating deposition method to form a layer preferably having a thickness of 0.1 to 15 nm after a layer of the organic material such as the light emitting material and the electron injecting material is formed as the interfacial zone.

When the reductive dopant is added to form islands, the reductive dopant alone is vapor deposited in accordance with the resistance heating deposition method to form islands preferably having a thickness of 0.1 to 15 nm after islands of the organic material such as the light emitting material and the electron injecting material were formed as the interfacial zone.

It is preferable that the relative amounts by mole of the main component and the reductive dopant in the electron injecting layer of the organic EL device of the present invention is in the range of 5:1 to 1:5 and more preferably in the range of 2:1 to 1:2.

In the organic EL device of the present invention, a hole transporting layer in which a phosphorescent light emitting material is added may be preferably sandwiched between the cathode and the anode. Further, it is preferable that the triplet energy of the hole transporting material in the hole transporting layer is greater than the excitation energy of the phosphorescent light emitting material in the light emitting layer.

Moreover, the conventional TPD or NPD below has triplet energy of 2.46 eV or 2.51 eV respectively, whereas the foregoing (K-10) on page 18 as the phosphorescent light emitting material in the light emitting layer has triplet energy of 2.55 eV.

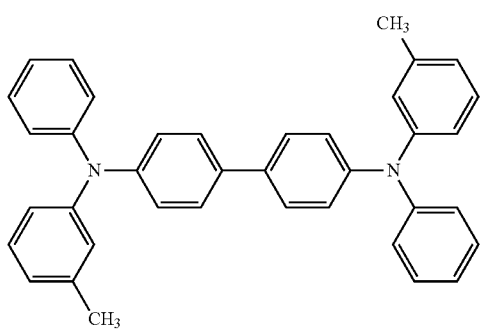

TPD

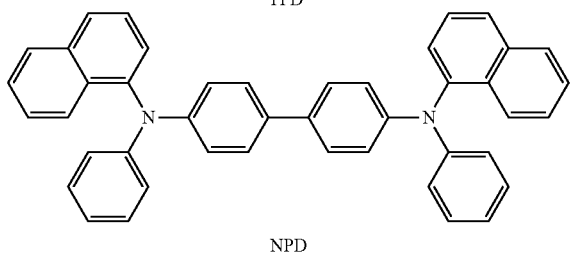

NPD

Accordingly, TPD or NPD above quenches the excited state of the light emitting layer. In other words, a hole transporting material whose triplet energy is greater than 2.55 eV or regulates quenching and enhances efficiency of light emission.

Specific examples of the hole transporting material having triplet energy of greater than 2.55 eV employed in the present invention include compounds below each represented by the following general formulae (10), (12), (14) to (17) and (19), each of which is preferably without having any condensed aromatic ring.

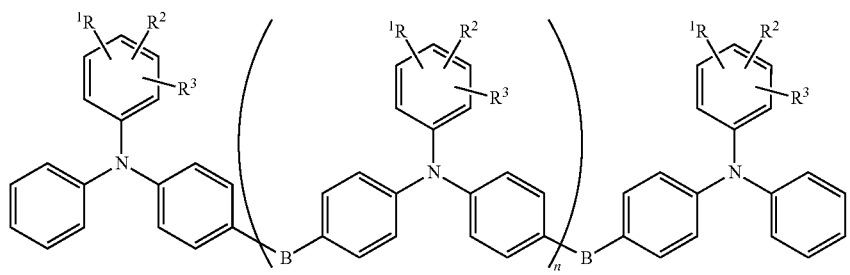

(10)

wherein n represents an integer of 0 to 3, $R^1$ to $R^3$ each independently represents a substituted or unsubstituted alkyl group having 1 to 30 carbon atoms, a substituted or unsubstituted alkoxyl group having 1 to 30 carbon atoms, a substituted or unsubstituted aryl group having 6 to 30 carbon atoms and a substituted or unsubstituted arylalkyl group having 6 to 30 carbon atoms, B represents an aliphatic ring residue group such as cyclohexylene or adamanthyl, and preferably represents an aliphatic ring residue group represented by the following general formula (11):

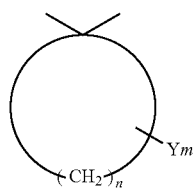

(11)

wherein Y represents a substituted or unsubstituted alkyl group or a substituted or unsubstituted aryl group, n represents an integer of 2 to 7, and m represents an integer of 0 to 2.

A-B-A (12)

wherein A represents a diamine derivative residue group represented by the general formula (13) below, B represents an adamanthyl aliphatic cyclic group and preferably represents the aliphatic ring residue group represented by the foregoing general formula (11).

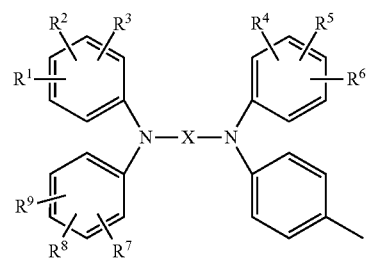

(13)

wherein $R^1$ to $R^9$ each independently represent a hydrogen atom, a halogen atom, a substituted or unsubstituted alkyl group, a substituted or unsubstituted alkoxyl group, a substituted or unsubstituted tio alkoxyl group, cyano group, amino group, mono- or di-substituted amino group, hydroxyl group, mercapto group, a substituted or unsubstituted aryloxy group, a substituted or unsubstituted arylthio group, a substituted or unsubstituted aromatic ring group or a substituted or unsubstituted heterocyclic group. However, at least any one of $R^1$ to $R^3$, $R^4$ to $R^6$ and $R^7$ to $R^9$ is not a hydrogen atom. Further, adjacent substituted groups may bond to form a substituted or unsubstituted ring of aliphatic group, a substituted or unsubstituted ring of carbon ring aromatic group, a substituted or unsubstituted ring of heterocyclic aromatic group, or a substituted or unsubstituted heterocyclic ring. X represents phenyl, biphenyl-yl or terphenyl-yl.

$$Ar^6 - N - \phantom{XXX} - X - \phantom{XXX} - N - Ar^8 \qquad (14)$$
$$\phantom{Ar^6 - N}Ar^7 \phantom{XXXXXXXXXXXXXXX} Ar^9$$

wherein $Ar^6$ to $Ar^9$ each independently represents an unsubstituted aromatic group or an aromatic group having 6 to 18 carbon atoms and substituted with alkyl group or alkoxyl group all of which may be the same or different each other; at least one among $Ar^6$ to $Ar^9$ is preferably biphenyl group or terphenyl group; X represents single bond or a divalent group comprising phenylene, biphenyl-yl, N-alkyl or N-arylcarvazole.

A diamine compound represented by:

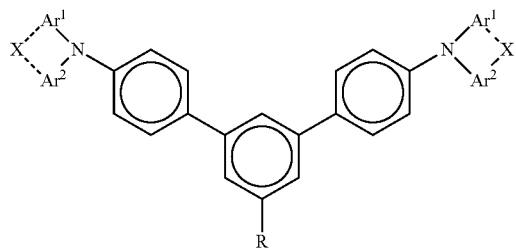
(15)

wherein $Ar^1$ and $Ar^2$ each independently represents a substituted or unsubstituted aryl group having 6 to 18 nuclear carbon atoms; R represents a substituted or unsubstituted alkyl group having 1 to 30 carbon atoms, a substituted or unsubstituted alkoxyl group, or a substituted or unsubstituted aryl group having 6 to 18 nuclear carbon atoms. X represents single bond, or a bonding group represented by alkylene, —O= or =S=; and X may be present or absent.

A triamine compound represented by:

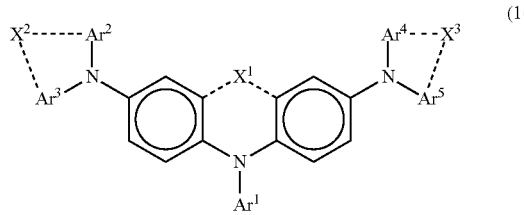
(16)

wherein $Ar^1$ represents a substituted or unsubstituted aryl group having 6 to 18 nuclear carbon atoms; $Ar^2$ to $Ar^5$ each independently represents a substituted or unsubstituted arylene group having 6 to 18 nuclear carbon atoms; X represents single bond, or a bonding group represented by alkylene, —O— or —S—; which may be present or absent; $X^2$ and $X^3$ each independently represents single bond, or a bonding group represented by alkylene, —O— or —S—, and which may be the same or different each other.

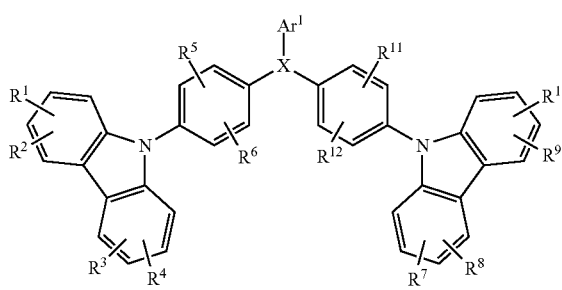
(17)

wherein $R^1$ to $R^{12}$ each independently represent hydrogen atom, a halogen atom, alkyl group, aralkyl group, alkenyl group, cyano group, amino group, acyl group, alkoxycarbonyl group, carboxyl group, an alkoxy group, alkylamino group, aralkyl amino group, haloalkyl group, hydroxy group, aryloxy group, a substituted or unsubstituted aromatic hydrocarbon group, or a substituted or unsubstituted aromatic heterocyclic group; and adjacent substituted groups of $R^1$ and $R^2$, $R^3$ and $R^4$, $R^5$ and $R^6$, $R^7$ and $R^8$, $R^9$ and $R^{10}$ or $R^{11}$ and $R^{12}$ may bond to form a ring.

X represents trivalent bonding group represented by the following:

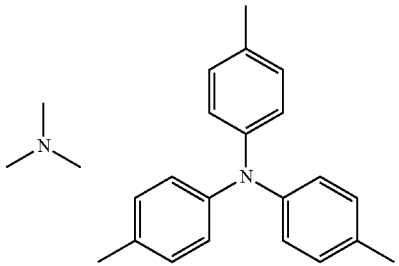

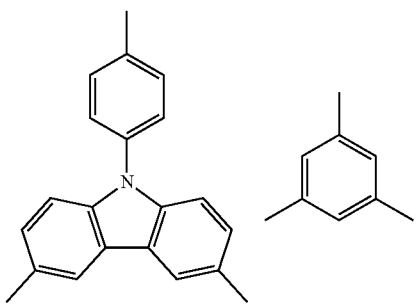

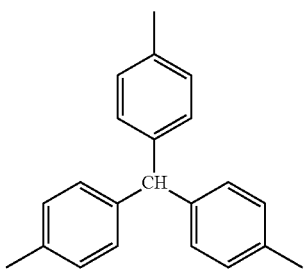

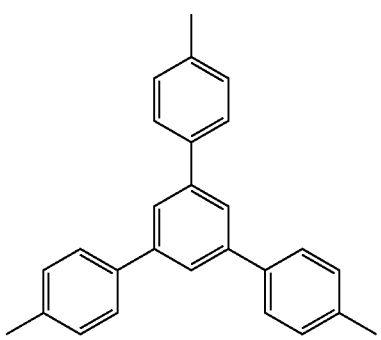

wherein $Ar^1$ represents a substituted or unsubstituted aromatic heterocyclic hydrocarbon group, a substituted or unsubstituted aromatic heterocyclic group or a group represented by the following general formula

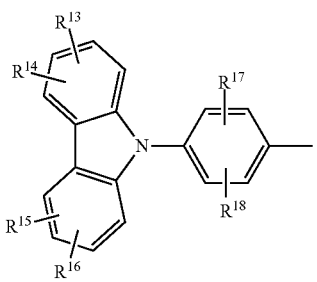

(18)

wherein $R^{13}$ to $R^{18}$ each independently represent hydrogen atom, a halogen atom, alkyl group, aralkyl group, alkenyl group, cyano group, a substituted or unsubstituted amino group, acyl group, alkoxycarbonyl group, carboxyl group, an alkoxyl group, alkyl amino group, aralkyl amino group, haloalkyl group, hydroxyl group, aryloxy group, a substituted or unsubstituted aromatic hydrocarbon group, or a substituted or unsubstituted aromatic heterocyclic group; and adjacent substituted groups of $R^{13}$ and $R^{14}$, $R^{15}$ and $R^{16}$, or $R^{17}$ and $R^{18}$ may bond to form a ring.

the alkali metal chalcogenide include $Li_2O$, $LiO$, $Na_2S$, $Na_2Se$ and $NaO$. Preferable examples of the alkaline earth metal chalcogenide include $CaO$, $BaO$, $SrO$, $BeO$, $BaS$ and $CaSe$. Preferable examples of the alkali metal halide include $LiF$, $NaF$, $KF$, $LiCl$, $KCl$ and $NaCl$. Preferable examples of the alkaline earth metal halide include fluorides such as $CaF_2$, $BaF_2$, $SrF_2$, $MgF_2$ and $BeF_2$ and halides other than the fluorides.

Examples of the semiconductor constituting the electron transporting layer include oxides, nitrides and oxide nitrides containing at least one element selected from Ba, Ca, Sr, Yb, Al, Ga, In, Li, Na, Cd, Mg, Si, Ta, Sb and Zn, which are used singly or in combination of two or more. It is preferable that the inorganic compound constituting the electron transporting layer is in the form of a fine crystalline or amorphous insulating thin film. When the electron transporting layer is constituted with the above insulating thin film, a more uniform thin film can be formed and defective pixels such as dark spots can be decreased. Examples of the inorganic compound include the alkali metal chalcogenides, the alkaline earth metal chalcogenides, the alkali metal halides and the alkaline earth metal halides which are described above.

The hole injecting layer and the hole transporting layer are layers which help injection of holes into the light emitting

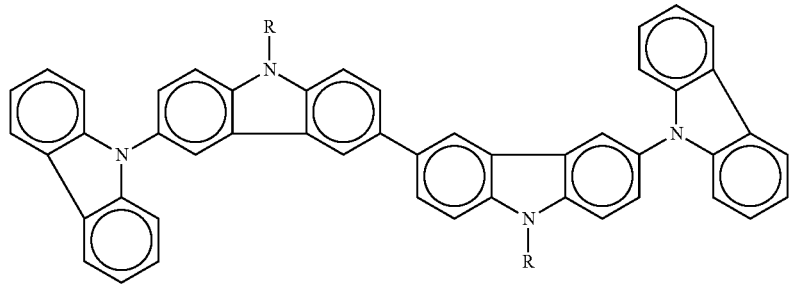

(19)

wherein R represents alkyl group, aralkyl group, a substituted or unsubstituted amino group, acyl group, alkoxycarbonyl group, carboxyl group, an alkoxyl group, alkylamino group, aralkyl amino group, haloalkyl group, hydroxyl group, aryloxy group, a substituted or unsubstituted aromatic hydrocarbon group, or a substituted or unsubstituted aromatic heterocyclic group.

Typical examples of the construction of the organic EL device include an anode/a light emitting layer/an electron injecting layer/a cathode; an anode/a hole injecting layer/a light emitting layer/an electron injecting layer/a cathode; an anode/a hole injecting layer/a hole transporting layer/a light emitting layer/an electron injecting layer/a cathode; and an anode/an insulating layer/a hole injecting layer/a hole transporting layer/a light emitting layer/an electron injecting layer/a cathode.

In the organic EL device of the present invention, an electron transporting layer formed with an insulating material or a semiconductor may be further sandwiched between the cathode and the organic thin film layer. The electron transporting layer effectively prevents leak in the electric current and improves the electron injecting capability.

It is preferable that at least one metal compound selected from the group consisting of alkali metal chalcogenides, alkaline earth metal chalcogenides, alkali metal halides and alkaline earth metal halides is used as the insulating material. It is preferable that the electron transporting layer is constituted with the above alkali metal chalcogenide since the electron injecting property can be improved. Preferable examples of layer and transport holes to the light emitting zone. The layers exhibit a great mobility of holes and, in general, have an ionization energy as small as 5.5 eV or smaller. For the hole injecting layer and the hole transporting layer, a material which transports holes to the light emitting layer under a small strength of the electric field is preferable. A material which exhibits, for example, a mobility of holes of at least $10^{-6}$ $cm^2/V \cdot second$ under application of an electric field of $10^4$ to $10^6$ V/cm is preferable. The mobility of holes of at least $10^{-6}$ $cm^2/V \cdot second$ under application of an electric field of $10^4$ to $10^6$ V/cm is more preferable The anode of the organic EL device plays the role of injecting holes into the hole transporting layer or the light emitting layer. It is effective that the anode has a work function of 4.5 eV or greater. Examples of the material of the anode used in the present invention include indium tin oxide alloys (ITO), tin oxides (NESA), gold, silver, platinum and copper. As the cathode, a material having a small work function is preferable so that electrons can be injected into the electron transporting layer or the light emitting layer. The material of the cathode is not particularly limited. Examples of the material of the cathode include indium, aluminum, magnesium, magnesium-indium alloys, magnesium-aluminum alloys, aluminum-lithium alloys, aluminum-scandium-lithium alloys and magnesium-silver alloys.

The process for forming the layers in the organic EL device of the present invention is not particularly limited. A conventional process such as the vacuum vapor deposition process and the spin coating process can be used. The organic thin film layer used in the organic EL device of the present invention can be formed in accordance with the vacuum vapor deposition process, the molecular beam epitaxy process (the MBE process) or, using a solution prepared by dissolving the compound into a solvent, in accordance with a conventional coating process such as the dipping process, the spin coating process, the casting process, the bar coating process and the roller coating process.

The thickness of each layer in the organic thin film layer in the organic EL device of the present invention is not particularly limited. In general, an excessively thin layer tends to have defects such as pin holes, and an excessively thick layer requires a high applied voltage results in decreasing the efficiency. Therefore, a thickness within the range of several nanometers to 1 μm is preferable.

The present invention will be described more specifically with reference to examples in the following. However, the present invention is not limited to the examples.

The triplet energy gap, the singlet energy gap and the ionization potential of a compound were measured in accordance with the following methods.

(1) Measurement of the Triplet Energy Gap

The lowest excited triplet energy level Tl was measured. The phosphorescence spectrum of a sample was measured (10 μmoles/liter; an EPA (diethyl ether:isopentane:ethanol=5:5:2 by volume) solution; 77K; a quartz cell; FLUO-ROLOG II manufactured by SPEX Company). A tangent was drawn to the increasing line at the short wavelength side of the phosphorescence spectrum and the wavelength at the intersection of the tangent and the abscissa (the end of light emission) was obtained. The obtained wavelength was converted into the energy.

(2) Measurement of the Singlet Energy Gap

The excited singlet energy gap was measured. Using a toluene solution ($10^{-5}$ moles/liter) of a sample, the absorption spectrum was obtained by a spectrometer for absorption of ultraviolet and visible light manufactured by HITACHI Co. Ltd. A tangent was drawn to the increasing line at the long wavelength side of the spectrum and the wavelength at the intersection of the tangent and the abscissa (the end of absorption) was obtained. The obtained wavelength was converted into the energy.

(3) Measurement of the Ionization Potential

The ionization potential of the compound was measured by means of photoelectron spectroscopy instrument: AC-1 produced by Riken Keiki Co., Ltd. using powder material as the object to be measured under the atmosphere of the air.

Example 1

A glass substrate (manufactured by GEOMATEC Company) of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The glass substrate having the transparent electrode which had been cleaned was adhered to a substrate holder of a vacuum vapor deposition apparatus. On the surface of the cleaned substrate at the side having the transparent electrode, a film of copper phthalocyanine (referred to as a film of CuPc, hereinafter) having a thickness of 10 nm was formed in a manner such that the formed film covered the transparent electrode. The formed film of CuPc worked as the hole injecting layer. On the formed film of CuPc, a film of 1,1'-bis[4-N,N-di(p-tolyl)aminophenyl]cyclohexane shown below (referred to as a film of TPAC, hereinafter) having a thickness of 30 nm was formed. The formed film of TPAC worked as the hole transporting layer. On the formed film of TPAC, a film of a compound PB 102 shown below having a thickness of 30 nm was formed by vapor deposition as the light emitting layer. At the same time, the foregoing phosphorescent Ir metallic complex (K-3) on page 17 was added to the light emitting layer. The content of the Ir metallic complex (K-3) in the light emitting layer was 7% by weight. The formed film of (K-3) worked as the light emitting layer. On the formed film of (K-3), a film of a complex of tris(8-quinolinolato)aluminum (Alq) was formed by vapor deposition. The formed film of Alq worked as the electron injecting layer. Thereafter, Li (the source of lithium: manufactured by SAES GETTERS Company) as the reductive dopant and Alq were binary vapor deposited and an Alq:Li film having a thickness of 10 nm was formed as the second electron injecting layer (the cathode). On the formed Alq:Li film, metallic aluminum was vapor deposited to form a metal cathode and an organic EL device was prepared.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 6.6 V was applied to the organic EL device prepared above, bluish green light was emitted with a luminance of 89 cd/m$^2$ and a current efficiency of 15.0 cd/A. Further, by measuring EL spectrum, it was found that the light emitting peak wavelength was 477 nm exhibiting that Ir metallic complex caused light emission. The results are shown in Table 1. In the Examples, although the energy gap of Alq employed for the electron injecting layer was smaller than that of the host material or of Ir complex each in the light emitting layer, and although the triplet energy of Alq employed for the electron injecting layer was smaller than that of the host material or of Ir complex each in the light emitting layer, the prepared organic EL devices revealed highly efficient light emission of bluish green at low voltage as will be described below.

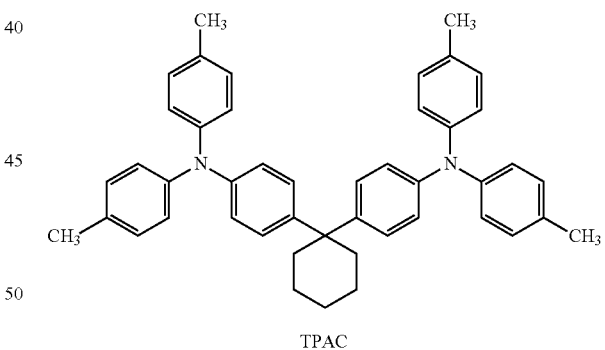

TPAC

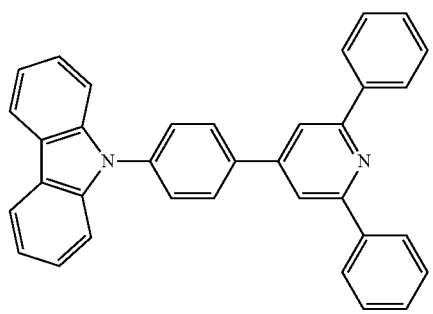

PB102

Comparative Example 1

Comparative Example with the Use of a Hole Transporting Light Emitting Layer and a Hole Blocking Layer A glass substrate (manufactured by GEOMATEC Company) of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The glass substrate having the transparent electrode which had been cleaned was adhered to a substrate holder of a vacuum vapor deposition apparatus. On the surface of the cleaned substrate at the side having the transparent electrode, a film of copper phthalocyanine (referred to as a film of CuPc, hereinafter) having a thickness of 10 nm was formed in a manner such that the formed film covered the transparent electrode. The formed film of CuPc worked as the hole injecting layer. On the formed film of CuPc, a film of the foregoing 4,4'-bis[N-(1-naphthyl)-N-phenylamino]biphenyl (a film of NPD) having a thickness of 30 nm was formed. The formed film of NPD worked as the hole transporting layer. On the formed film of NPD, a film having a thickness of 30 nm of a hole transportable compound CBP shown below as a host material was vapor deposited to form the light emitting layer. At the same time, the foregoing phosphorescent Ir metallic complex (K-3) on page 17 was added to the light emitting layer. The content of the Ir metallic complex (K-3) in the light emitting layer was 7% by weight. The formed film of (K-3) worked as the light emitting layer. On the formed film of (K-3), a film of (1,1'-bisphenyl)-4-olate)bis(2-methyl-8-quinolinolato) aluminum (referred to as a film of BAlq, hereinafter) having a thickness of 10 nm was formed. The formed film of BAlq worked as the hole blocking layer. Thereafter, Li (the source of lithium: manufactured by SAES GETTERS Company) as the reductive dopant and Alq were binary vapor deposited and an Alq:Li film having a thickness of 10 nm was formed as the second electron injecting layer (the cathode). On the formed Alq:Li film, metallic aluminum was vapor deposited to form a metal cathode and an organic EL device was prepared.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 7.2 V was applied to the organic EL device prepared above, bluish green light was emitted with a luminance of 98 cd/m² and a current efficiency of 3.2 cd/A. This result appeared to be caused by deactivating the excitation state of the light emitting layer and by quenching light because the hole transporting compound was employed as the host material in the light emitting layer. The results are shown in Table 1.

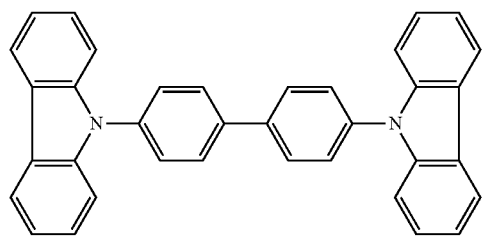

CBP

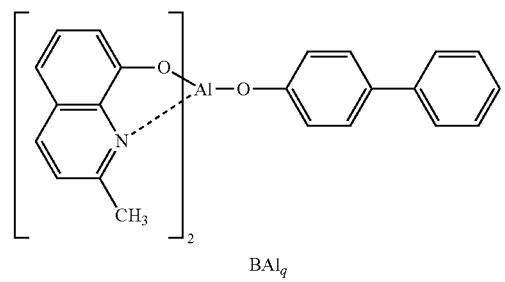

BAl$_q$

Comparative Example 2

Comparative Example with the Use of a Hole Transporting Light Emitting Layer

An organic EL device was prepared in a similar manner as Example 1 except that the above CBP with hole transporting capability was employed in place of the compound PB 102 as the host material in the light emitting layer.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 6.8 V was applied to the organic EL device prepared above, bluish green light was emitted with a luminance of 1.2 cd/m² and a current efficiency of 0.3 cd/A. This result appeared to be caused by deactivating the excitation state of the light emitting layer and by quenching light because the hole transporting compound was employed as the host material in the light emitting layer. Further, it became clear by referring to Comparative Example 1, that a hole blocking layer is necessary in order to get a favorable efficiency of light emission. The results are shown in Table 1.

Example 2

An organic EL device was prepared in a similar manner as Example 1 except that PB 115 with electron transporting capability below was employed in place of the compound PB 102 as the host material in the light emitting layer.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 6.5 V was applied to the organic EL device prepared above, bluish green light was emitted with a luminance of 102 cd/m² and a current efficiency of 14.8 cd/A. The results are shown in Table 1,

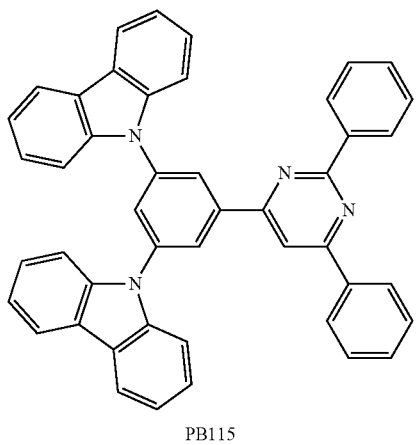 [SMILES: "PB115" ; c1ccc(-c2cc(-c3cc(-n4c5ccccc5c5ccccc54)cc(-n4c5ccccc5c5ccccc54)c3)nc(-c3ccccc3)n2)cc1]

PB115

Example 3

An organic EL device was prepared in a similar manner as Example 1 except that the foregoing BAlq was employed in place of Alq and Alq:Li forming the electron injecting layer, and that Li was added at 20 nm in the cathode side of BAlq. In this case, the light emitting layer directly adheres with the electron injecting layer, and the cathode adheres with BAlq layer.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 7.8 V was applied to the organic EL device prepared above, bluish green light was emitted with a luminance of 93 cd/m$^2$ and a current efficiency of 12.3 cd/A. The results are shown in Table 1.

Example 4

A glass substrate (manufactured by GEOMATEC Company) of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The glass substrate having the transparent electrode which had been cleaned was adhered to a substrate holder of a vacuum vapor deposition apparatus. On the surface of the cleaned substrate at the side having the transparent electrode, a film of the foregoing NPD film having a thickness of 50 nm was formed in a manner such that the formed film covered the transparent electrode. The formed film of NPD worked as the hole transporting layer. On the formed film of NPD, a film having a thickness of 30 nm of an electron transportable compound PB115 shown above as a host material was vapor deposited to form the light emitting layer. At the same time, the foregoing phosphorescent Ir metallic complex (K-10) on page 18 was added to the light emitting layer. The content of the Ir metallic complex (K-10) in the light emitting layer was 5% by weight. The formed film of (K-10) worked as the light emitting layer. On the formed film of (K-10), a film of Alq was formed by vapor deposition. Thereafter, Li (the source of lithium: manufactured by SAES GETTERS Company) as the reductive dopant and Alq were binary vapor deposited and an Alq:Li film having a thickness of 30 nm was formed as the second electron injecting layer (the cathode). On the formed Alq:Li film, metallic aluminum was vapor deposited to form a metal cathode and an organic EL device was prepared.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 4.5 V was applied to the organic EL device prepared above, green light was emitted with a luminance of 620 cd/m$^2$ and a current efficiency of 32.5 cd/A. The results are shown in Table 1.

Comparative Example 3

Comparative Example with the Use of a Hole Transporting Light Emitting Layer

An organic EL device was prepared in a similar manner as Example 4 except that CBP with hole transporting capability above was employed in place of the compound PB 115 as the host material in the light emitting layer.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 5.1 V was applied to the organic EL device prepared above, green light was emitted with a luminance of 101 cd/m$^2$ and a current efficiency of 5.7 cd/A.

This result appeared to be caused by deactivating the excitation state of the light emitting layer and by quenching light because the hole transporting compound was employed as the host material in the light emitting layer. The results are shown in Table 1.

Comparative Example 4

Comparative Example with the Use of an Electron Transportable Light Emitting Layer Containing the Host Material with the Ionization Potential of Greater than 5.9 eV An organic EL device was prepared in a similar manner as Example 4 except that BCP with electron transporting capability below was employed in place of the compound PB115 as the host material in the light emitting layer.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 6.2 V was applied to the organic EL device prepared above, green light was emitted with a luminance of 320 cd/m$^2$ and a current efficiency of 30.2 cd/A, evading quench in the light emitting layer. However, it was necessary that the voltage was 1.7 V higher than that of the organic EL device in Example 4 in order to obtain the efficiency of light emission almost equal to the organic EL device in Example 4. This was caused by the prohibition of hole injection because the ionization potential of compound BCP is high. The results are shown in Table 1.

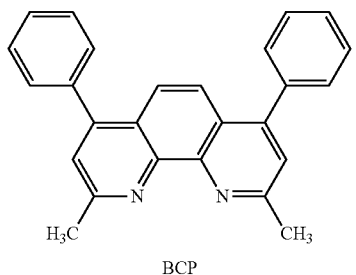 [SMILES: Cc1cc(-c2ccccc2)c2ccc3c(-c4ccccc4)cc(C)nc3c2n1 ; "BCP"]

BCP

Example 5

An organic EL device was prepared in a similar manner as Example 2 except that TCTA below was employed as the material for the hole transporting layer in place of TPAC, that the foregoing (K-23) on page 20 was added as the phosphorescent Ir metallic complex in place of (K-3), and that the foregoing compound (A-7) on page 41 was employed as the electron transporting material in the electron injecting layer in place of Alq.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 6.0 V was applied to the organic EL device prepared above, bluish green light was emitted with a luminance of 104 cd/m² and an extraordinarily enhanced efficiency of the light emission of 20.8 cd/A. The results are shown in Table 1.

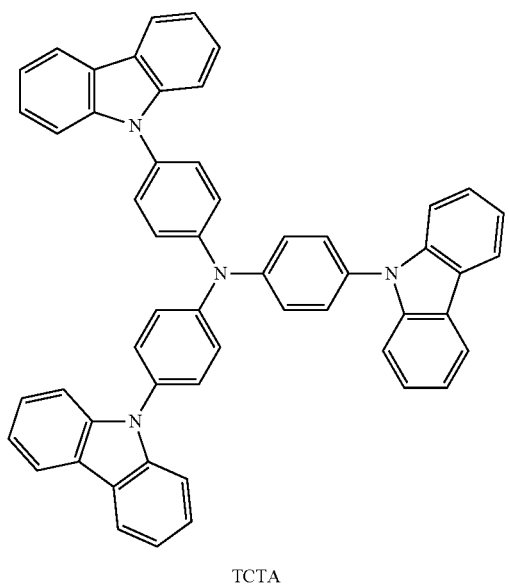 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

TCTA

Example 6

An organic EL device was prepared in a similar manner as Example 5 except that the foregoing compound (C-15) on page 57 was employed as the electron transporting material in the electron injecting layer in place of the compound (A-7) on page 41.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 6.1 V was applied to the organic EL device prepared above, bluish green light was emitted with a luminance of 105 cd/m² and an extraordinarily enhanced efficiency of the light emission of 23.1 cd/A. The results are shown in Table 1.

Comparative Example 5

Comparative Example with the Use of a Hole Transportable Light Emitting Layer

An organic EL device was prepared in a similar manner as Example 5 except that the foregoing compound CBP with hole transporting capability was employed in place of the compound PB115 as the host material in the light emitting layer.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 6.3 V was applied to the organic EL device prepared above, bluish green light was emitted with a luminance of 102 cd/m² and a current efficiency of 9.2 cd/A, which was very lower than that in Example 5. This result appeared to be caused by deactivating the excitation state of the light emitting layer and by quenching light because the hole transporting compound was employed as the host material in the light emitting layer. The results are shown in Table 1.

Comparative Example 6

Comparative Example with the Use of an Electron Transportable Light Emitting Layer Containing the Host Material with the Ionization Potential of Greater than 5.9 eV An organic EL device was prepared in a similar manner as Example 5 except that TPBI (2,2',2"-(1,3,5-phenylene)tris[1-phenyl-1H-benzimidazole] below with electron transporting capability was employed as the host material in the a light emitting layer in place of the compound PB 115. A method for synthesizing TPBI is taught in Japanese Unexamined Patent Application Laid-Open No. Hei 10-106749.

The host materials in the light emitting layer, their ionization potential, their energy gap (singlet energy) and their triplet energy, the phosphorescent light emitting materials in the light emitting layer (metallic complex) and their triplet energy, the electron transporting materials in the electron injecting layer, their energy gap and their triplet energy and materials of the hole transport layer are shown in Table 1.

When a direct current voltage of 7.6 V was applied to the organic EL device prepared above, bluish green light was emitted with a luminance of 102 cd/m² and a current efficiency of 14.6 cd/A, evading quench in the light emitting layer. However, it was necessary that the voltage was 1.6 V higher than that of the organic EL device in Example 5 in order to obtain the efficiency of light emission almost equal to the organic EL device in Example 5. This was caused by the regulation of hole injection because the ionization potential of compound TPBI is high. The results are shown in Table 1.

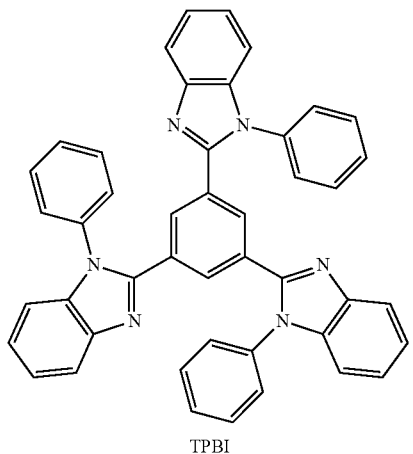

TPBI

As shown in Table 1, it was probable that an energy transfer generated and the excitation state quenched in the organic EL devices of Examples 1 to 6 because the energy gap of the host material in the light emitting layer was greater than that of the electron transporting material in the electron injecting layer. Further, it was also probable that an energy transfer generated and the excitation state quenched in the organic EL devices of Examples 1 to 6 because the triplet energy of the host material in the light emitting layer and the triplet energy of metallic complex is greater than that of the electron transporting material in the electron injecting layer. However, the employment of a light emitting layer with electron transporting capability achieved high efficiency of light emission.

Further, a comparison of Example 4 with Comparative Example 4, or a comparison of Example 5 with Comparative Example 6 verified the possibility of low voltage drive when the ionization potential of the host material in the light emitting layer is small in Examples 5 and 6.

On the other hand, the organic EL device in Comparative Examples 1 to 3 or in Comparative Example 5 exhibited that the excitation state quenched and that the efficiency of light emission was low.

INDUSTRIAL APPLICABILITY

As explained in the detail description, the organic EL device in accordance with the present invention emits phosphorescent light with enhanced efficiency because it comprises a light emitting layer and an electron injecting layer both satisfying specified condition and employs a light emitting layer capable of electron transporting. Accordingly, the present invention is practical for the full color organic EL device.

TABLE 1

| | Light Emitting Layer | | | | | Electron Injecting Layer | | | Evaluation of EL device | | | | |
|---|---|---|---|---|---|---|---|---|---|---|---|---|---|
| | Host Material | | | Metal Complex | | Electron Transporting Material | | | Hole | | | | |
| Kind | Ionization Potential (eV) | Energy Gap (eV) | Triplet Energy (eV) | Kind | Triplet Energy (eV) | Kind | Energy Gap (eV) | Triplet Energy (eV) | Transporting Layer | Voltage (V) | Luminance (cd/m²) | Current Efficiency (cd/A) | Color of Emitted Light |
| EX. 1 | PB102 | 5.74 | 3.48 | 2.81 | K-3 | 2.76 | Alq | 2.7 | 2.51 | TPAC | 6.6 | 89 | 15.0 | Bluish Green |
| EX. 2 | PB115 | 5.71 | 3.2 | 2.9 | K-3 | 2.76 | Alq | 2.7 | 2.51 | TPAC | 6.5 | 102 | 14.8 | Bluish Green |
| EX. 3 | PB102 | 5.74 | 3.48 | 2.81 | K-3 | 2.76 | BAlq | 2.85 | Unknown | TPAC | 7.8 | 93 | 12.3 | Bluish Green |
| EX. 4 | PB115 | 5.71 | 3.2 | 2.9 | K-10 | 2.55 | Alq | 2.7 | 2.51 | TPAC | 4.5 | 620 | 32.5 | Green |
| Co. Ex. 1 | CBP | 5.86 | 3.56 | 2.81 | K-3 | 2.76 | BAlq* | 2.85 | Unknown | TPAC | 7.2 | 98 | 3.2 | Bluish Green |
| Co. EX. 2 | CBP | 5.86 | 3.56 | 2.81 | K-3 | 2.76 | Alq | 2.7 | 2.51 | TPAC | 6.8 | 1.2 | 0.3 | Bluish Green |
| Co. EX. 3 | CBP | 5.86 | 3.56 | 2.81 | K-10 | 2.55 | Alq | 2.7 | 2.51 | TPAC | 5.1 | 101 | 5.7 | Green |
| Co. EX. 4 | BCP | 6.4 | 3.5 | 2.69 | K-10 | 2.55 | Alq | 2.7 | 2.51 | TPAC | 6.2 | 320 | 30.2 | Green |
| EX. 5 | PB115 | 5.71 | 3.2 | 2.9 | K-23 | 2.75 | (A-7) | 2.97 | 2.7 | TCTA | 6.0 | 104 | 20.8 | Bluish Green |
| EX. 6 | PB115 | 5.71 | 3.2 | 2.9 | K-23 | 2.75 | (C-15) | 3.04 | 2.74 | TCTA | 6.1 | 105 | 23.1 | Bluish Green |
| Co. EX. 5 | CBP | 5.86 | 3.56 | 2.81 | K-23 | 2.75 | (A-7) | 2.97 | 2.7 | TCTA | 6.3 | 102 | 9.2 | Bluish Green |
| Co. EX. 6 | TPBI | 6.7 | 4 | 2.8 | K-23 | 2.75 | (A-7) | 2.97 | 2.7 | TCTA | 7.6 | 102 | 14.6 | Bluish Green |

*BAlq in Comparative Example 1 is a hole barrier layer.

What is claimed is:

1. An organic electroluminescence device comprising: a cathode; an anode; at least one light emitting layer comprising a phosphorescent light emitting material and a host material, which light emitting layer is sandwiched between the cathode and the anode; and an electron injecting layer which comprises an electron injecting layer material and is adhered directly to the light emitting layer; wherein:

an ionization potential of the host material is 5.9 eV or smaller;

an energy gap of the electron injecting layer material is smaller than that of the host material; and the electron injecting layer material comprises at least one compound selected from the group consisting of compounds represented by formula (A), (B) or (C):

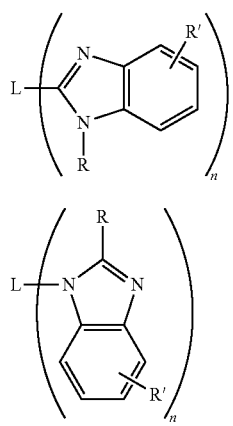

(A)

(B)

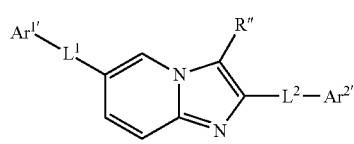

(C)

wherein n is 1 or 2;

when n is 1, L is represented by -L'-Ar$^1$-Ar$^2$ and when n is 2, L is represented by -L'-Ar$^1$-L'-;

L' is a single bond, a residue of condensed aromatic ring, a residue of aromatic hetero ring, or a residue of uncondensed aromatic ring, each being optionally substituted;

Ar$^1$ of -L'-Ar$^1$-Ar$^2$ is a residue of condensed aromatic ring, a residue of aromatic hetero ring, or a residue of uncondensed aromatic ring, each being optionally substituted;

Ar$^1$ of -L'-Ar$^1$-L'- is a residue of condensed aromatic ring which is optionally substituted;

Ar$^2$ is a residue of condensed aromatic ring, a residue of aromatic hetero ring, or a residue of uncondensed aromatic ring, each being optionally substituted; and each of R and R' is independently a hydrogen atom, an aliphatic hydrocarbon group, an aromatic hydrocarbon group or a heterocyclic group; and wherein Ar$^{1'}$ represents a substituted or unsubstituted aryl group having 6 to 60 nuclear carbon atoms or a substituted or unsubstituted heteroaryl group having 3 to 60 nuclear carbon atoms;

Ar$^{2'}$ represents hydrogen atom, a substituted or unsubstituted aryl group having 6 to 60 nuclear carbon atoms, a substituted or unsubstituted heteroaryl group having 3 to 60 nuclear carbon atoms, a substituted or unsubstituted alkyl group having 1 to 20 carbon atoms, or a substituted or unsubstituted alkoxyl group having 1 to 20 carbon atoms;

at least one of the groups represented by Ar$^{1'}$ and Ar$^{2'}$ is substituted or unsubstituted condensed cyclic group having 10 to 60 nuclear carbon atoms or a substituted or unsubstituted condensed mono-heterocyclic group having 3 to 60 nuclear carbon atoms;

each of L$^1$ and L$^2$ independently represents a single bond, a substituted or unsubstituted arylene group having 6 to 60 nuclear carbon atoms, a substituted or unsubstituted heteroarylene group having 3 to 60 nuclear carbon atoms, or a substituted or unsubstituted fluorenylene group; and R" represents a hydrogen atom, a substituted or unsubstituted aryl group having 6 to 60 nuclear carbon atoms, a substituted or unsubstituted heteroaryl group having 3 to 60 nuclear carbon atoms, a substituted or unsubstituted alkyl group having 1 to 20 carbon atoms, or a substituted or unsubstituted alkoxyl group having 1 to 20 carbon atoms;

provided that the light emitting layer does not include 4,4'-di(N-carbazolyl)biphenyl.

2. An organic electroluminescence device according to claim 1, wherein the host material is an electron transporting material having an electron mobility of $10^{-5}$ cm$^2$/V·s or greater.

3. The organic electroluminescence device according to claim 1, wherein the host material comprises a compound represented by the following structure:

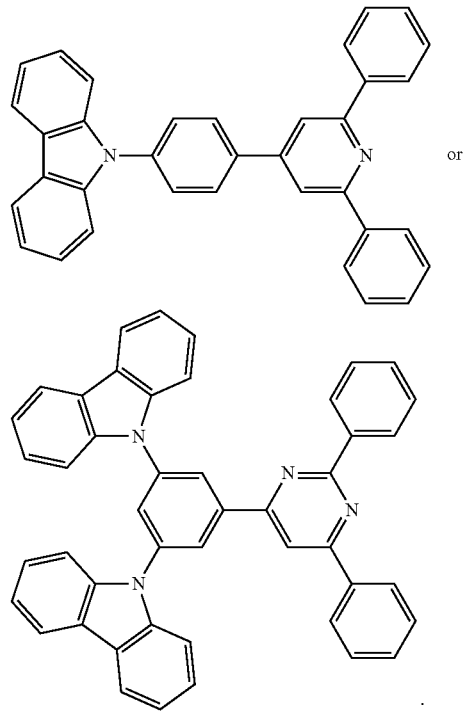

4. An organic electroluminescence device according to claim 1, wherein the electron injecting layer does not include a metallic complex.

5. The organic electroluminescence device according to claim 1, wherein a reductive dopant is added in either said electron injecting layer or in the interfacial zone between said cathode and a layer adhered to said cathode.

6. An organic electroluminescence device according to claim 1, wherein the host material is represented by formula (1) or (2):

(Cz-)$_m$A  (1),

Cz-A$_n$  (2), wherein Cz represents a substituted or unsubstituted carbazolyl group or a substituted or unsubstituted azacarbazolyl group; A represents an aryl-substituted ring group having nitrogen atom, a diaryl-substituted ring group having nitrogen atom, or a triaryl-substituted ring group having nitrogen atom; and m or n is an integer of 1 to 3; and the ring group having nitrogen atom in A is selected from the group consisting of pyridine, quinoline, pyrazine, pyrimidine, quinoxaline, triazine, imidazole, imidazo[1,2-a]pyridine, and pyridazine.

7. The organic electroluminescence device according to claim 6, wherein said ring group having nitrogen atom in A is pyridine or pyrimidine.

8. The organic electroluminescence device according to claim 1, further comprising a hole transporting layer with a phosphorescent light emitting material sandwiched between said cathode and said anode.

9. The organic electroluminescence device according to claim 8, wherein a triplet energy of a hole transporting material in said hole transporting layer is greater than the exciting energy of said phosphorescent light emitting material in said light emitting layer.

10. An organic electroluminescence device comprising: a cathode; an anode; at least one light emitting layer comprising a phosphorescent light emitting material and a host material, which light emitting layer is sandwiched between the cathode and the anode; and an electron injecting layer which comprises an electron injecting layer material and is adhered directly to the light emitting layer; wherein:

an ionization potential of the host material is 5.9 eV or smaller;
a triplet energy of the electron injecting layer material is smaller than that of the host material; and
the electron injecting layer material comprises at least one compound selected from the group consisting of compounds represented by formula (A), (B) or (C):

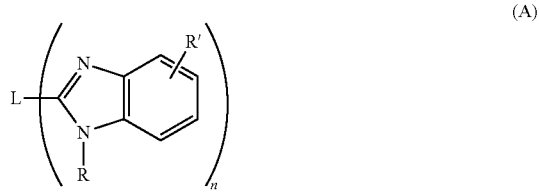

(A)

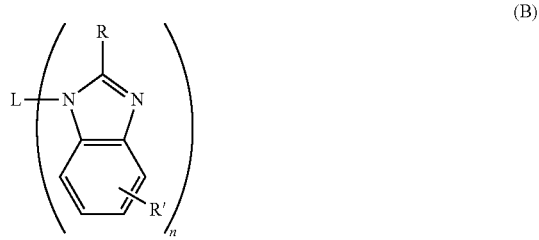

(B)

wherein n is 1 or 2;
when n is 1, L is represented by -L'-Ar$^1$-Ar$^2$ and when n is 2, L is represented by -L'-Ar$^1$-L'-;

L' is a single bond, a residue of condensed aromatic ring, a residue of aromatic hetero ring, or a residue of uncondensed aromatic ring, each being optionally substituted;

Ar$^1$ of -L'-Ar$^1$-Ar$^2$ is a residue of condensed aromatic ring, a residue of aromatic hetero ring, or a residue of uncondensed aromatic ring, each being optionally substituted;

Ar$^1$ of -L'-Ar$^1$-L'- is a residue of condensed aromatic ring, which is optionally substituted;

Ar$^2$ is a residue of condensed aromatic ring, a residue of aromatic hetero ring, or a residue of uncondensed aromatic ring, each being optionally substituted; and each of R and R' is independently a hydrogen atom, an aliphatic hydrocarbon group, an aromatic hydrocarbon group or a heterocyclic group; and

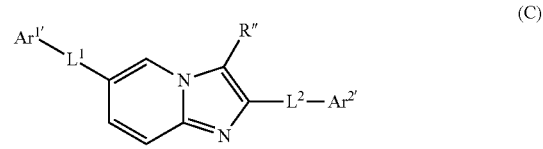

(C)

wherein Ar$^{1'}$ represents a substituted or unsubstituted aryl group having 6 to 60 nuclear carbon atoms or a substituted or unsubstituted heteroaryl group having 3 to 60 nuclear carbon atoms;

Ar$^{2'}$ represents hydrogen atom, a substituted or unsubstituted aryl group having 6 to 60 nuclear carbon atoms, a substituted or unsubstituted heteroaryl group having 3 to 60 nuclear carbon atoms, a substituted or unsubstituted alkyl group having 1 to 20 carbon atoms, or a substituted or unsubstituted alkoxyl group having 1 to 20 carbon atoms;

at least one of the groups represented by Ar$^{1'}$ and Ar$^{2'}$ is a substituted or unsubstituted condensed cyclic group having 10 to 60 nuclear carbon atoms or a substituted or unsubstituted condensed mono-heterocyclic group having 3 to 60 nuclear carbon atoms;

each of L$^1$ and L$^2$ independently represents a single bond, a substituted or unsubstituted arylene group having 6 to 60 nuclear carbon atoms, a substituted or unsubstituted heteroarylene group having 3 to 60 nuclear carbon atoms, or a substituted or unsubstituted fluorenylene group; and R" represents a hydrogen atom, a substituted or unsubstituted aryl group having 6 to 60 nuclear carbon atoms, a substituted or unsubstituted heteroaryl group having 3 to 60 nuclear carbon atoms, a substituted or unsubstituted alkyl group having 1 to 20 carbon atoms, or a substituted or unsubstituted alkoxyl group having 1 to 20 carbon atoms;

provided that the light emitting layer does not include 4,4'-di(N-carbazolyl)biphenyl.

11. An organic electroluminescence device according to claim 10, wherein the host material is an electron transporting material having an electron mobility of 10$^{-5}$ cm$^2$/V·s or greater.

12. The organic electroluminescence device according to claim 10, wherein the host material comprises a compound represented by the following structure:

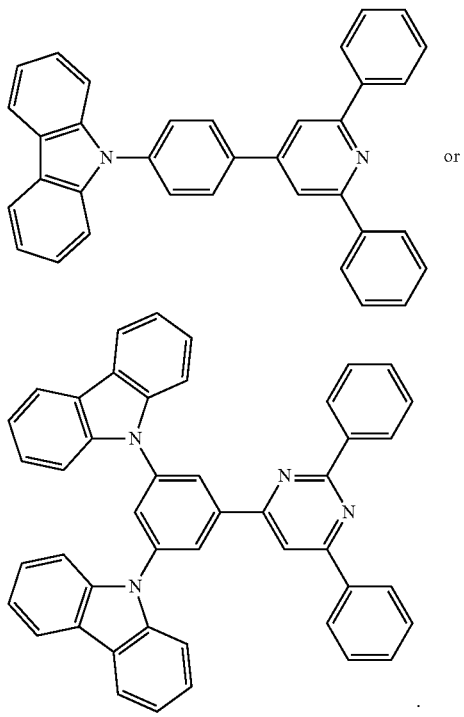

13. An organic electroluminescence device according to claim 10, wherein the electron injecting layer does not include a metallic complex.

14. The organic electroluminescence device according to claim 10, wherein a reductive dopant is added in either said electron injecting layer or in the interfacial zone between said cathode and a layer adhered to said cathode.

15. The organic electroluminescence device according to claim 10, wherein the host material is represented by formula (1) or (2):

$$(Cz-)_m A \qquad (1),$$

$$Cz-A_n \qquad (2),$$

wherein Cz represents a substituted or unsubstituted carbazolyl group or a substituted or unsubstituted azacarbazolyl group; A represents an aryl-substituted ring group having nitrogen atom, a diaryl-substituted ring group having nitrogen atom, or a triaryl-substituted ring group having nitrogen atom; and m or n is an integer of 1 to 3; and the ring group having nitrogen atom in A is selected from the group consisting of pyridine, quinoline, pyrazine, pyrimidine, quinoxaline, triazine, imidazole, imidazo[1,2-a]pyridine, and pyridazine.

16. The organic electroluminescence device according to claim 15, wherein said ring group having nitrogen atom in A is pyridine or pyrimidine.

17. The organic electroluminescence device according to claim 10, further comprising a hole transporting layer with a phosphorescent light emitting material sandwiched between said cathode and said anode.

18. The organic electroluminescence device according to claim 17, wherein a triplet energy of a hole transporting material in said hole transporting layer is greater than the exciting energy of said phosphorescent light emitting material in said light emitting layer.

* * * * *